US010199472B2

(12) United States Patent
Lee

(10) Patent No.: US 10,199,472 B2
(45) Date of Patent: Feb. 5, 2019

(54) NEUROMORPHIC DEVICE INCLUDING GATING LINES WITH DIFFERENT WIDTHS

(71) Applicant: SK hynix Inc., Icheon (KR)

(72) Inventor: Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/389,068

(22) Filed: Dec. 22, 2016

(65) Prior Publication Data

US 2017/0194446 A1   Jul. 6, 2017

Related U.S. Application Data

(60) Provisional application No. 62/273,221, filed on Dec. 30, 2015.

(30) Foreign Application Priority Data

Oct. 19, 2016   (KR) ........................ 10-2016-0135651

(51) Int. Cl.
*H01L 29/423* (2006.01)
*H01L 27/105* (2006.01)
*G06N 3/04* (2006.01)
*H01L 29/66* (2006.01)
*H01L 29/78* (2006.01)

(52) U.S. Cl.
CPC ......... *H01L 29/42368* (2013.01); *G06N 3/04* (2013.01); *H01L 27/1052* (2013.01); *H01L 29/66666* (2013.01); *H01L 29/7827* (2013.01); *H01L 29/7831* (2013.01)

(58) Field of Classification Search
CPC ........... H01L 27/11582; H01L 27/1157; H01L 27/11556; H01L 27/11524; H01L 27/11565; H01L 45/085; H01L 45/1233; H01L 45/148; H01L 45/145; H01L 45/146; G06N 3/049; G06N 3/0635; G06N 3/063
See application file for complete search history.

(56) References Cited

U.S. PATENT DOCUMENTS

| | | | |
|---|---|---|---|
| 8,445,881 B2 | 5/2013 | Awaya et al. | |
| 9,178,077 B2 * | 11/2015 | Davis | H01L 27/11556 |
| 9,934,463 B2 * | 4/2018 | Seo | G06N 3/088 |
| 2004/0063274 A1 * | 4/2004 | Hsu | G11C 11/5685 |
| | | | 438/238 |
| 2010/0258852 A1 * | 10/2010 | Lim | H01L 27/11551 |
| | | | 257/324 |
| 2011/0002178 A1 * | 1/2011 | Hwang | H01L 27/11578 |
| | | | 365/189.011 |
| 2015/0028278 A1 * | 1/2015 | Lee | H01L 45/085 |
| | | | 257/2 |

* cited by examiner

*Primary Examiner* — Tony Tran

(57) ABSTRACT

A neuromorphic device includes a row line extending in a first direction; a column line disposed over the row line, the column line extending in a second direction perpendicular to the first direction; a plurality of gating lines disposed between the row line and the column line; and a synapse disposed between the row line and the column line, the synapse passing through the plurality of gating lines.

12 Claims, 28 Drawing Sheets

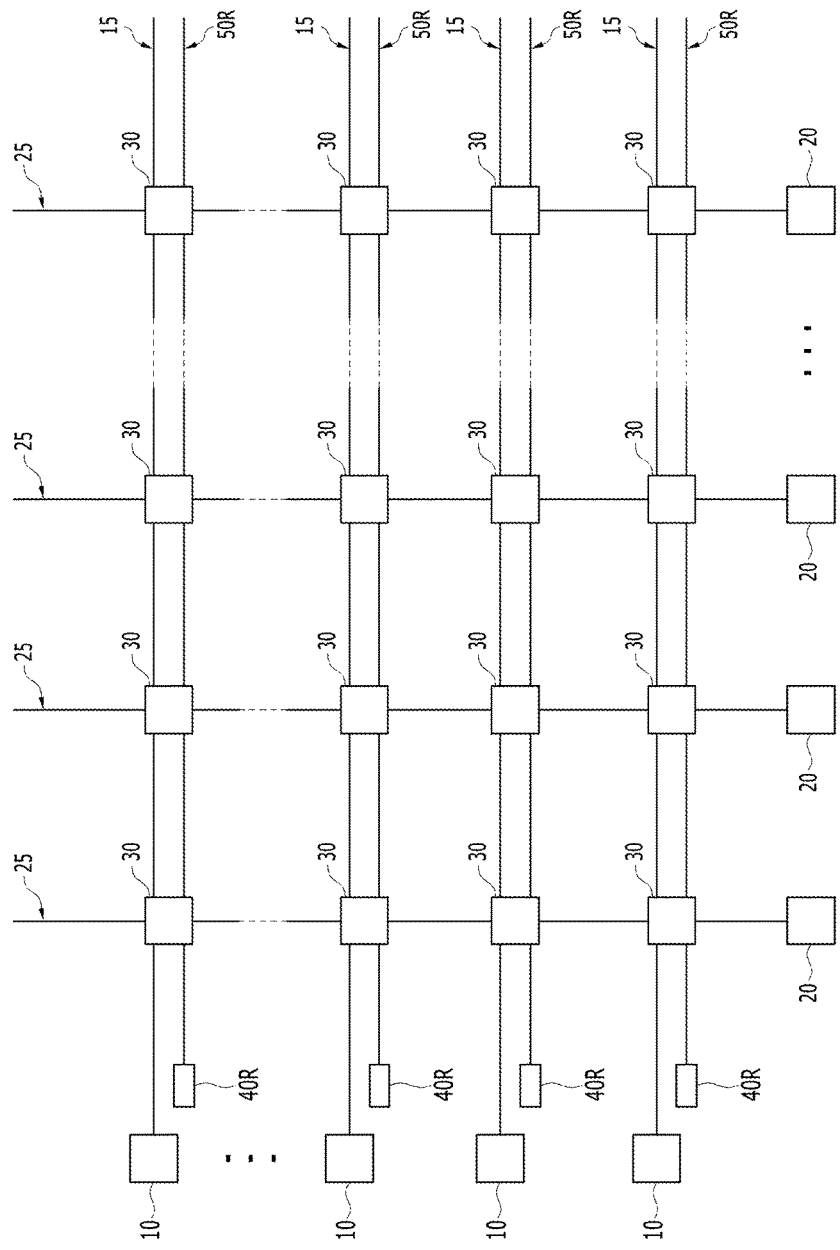

NEUROMORPHIC DEVICE INCLUDING GATING LINES WITH DIFFERENT WIDTHS

CROSS-REFERENCE TO RELATED APPLICATION

This application claims priority to U.S. Provisional Patent Application No. 62/273,221, filed on Dec. 30, 2015, and Korean Patent Application No. 10-2016-0135651, filed on Oct. 19, 2016, which are incorporated herein by reference in their entirety.

TECHNICAL FIELD

Exemplary embodiments relate to a neuromorphic device, and more particularly, to a neuromorphic device including a plurality of gating lines that surround an outer surface of a synapse and that have different widths.

DISCUSSION OF THE RELATED ART

Recently, much attention has been paid to neuromorphic technology, which uses chips that mimic the human brain. A neuromorphic device based on the neuromorphic technology includes a plurality of pre-synaptic neurons, a plurality of post-synaptic neurons, and a plurality of synapses. The neuromorphic device outputs pulses or spikes having various levels, magnitudes, or times, according to learning states of the neuromorphic device. A synapse system of the neuromorphic device has an improved performance when the synapse system has multiple resistance levels.

SUMMARY

Various embodiments are directed to a synapse system which has multiple resistance levels by using gating lines with various widths.

Various embodiments are directed to a neuromorphic device including a synapse system which has multiple resistance levels by using gating lines with various widths.

Various objects to be achieved by the disclosure are not limited to the aforementioned objects, and those skilled in the art to which the disclosure pertains may clearly understand other objects from the following descriptions.

In an embodiment, a neuromorphic device may include: a row line extending in a first direction; a column line disposed over the row line, the column line extending in a second direction perpendicular to the first direction; a plurality of gating lines disposed between the row line and the column line; and a synapse disposed between the row line and the column line, the synapse passing through the plurality of gating lines.

The plurality of gating lines may be disposed to be parallel.

At least one of the plurality of gating lines may be parallel to one of the row line and the column line.

The plurality of gating lines may have different thicknesses.

The plurality of gating lines may respectively surround portions of an outer surface of the synapse.

The neuromorphic device may further include a plurality of absorption layers respectively disposed between the plurality of gating lines and the synapse.

Each of the plurality of absorption layers may include an oxidizable metal.

The plurality of absorption layers may have hollow cylinder shapes that respectively surround portions of an outer surface of the synapse.

The neuromorphic device may further include a plurality of barrier layers respectively disposed between the plurality of gating lines and the plurality of absorption layers.

Each of the plurality of barrier layers may include one or more of gold (Au), platinum (Pt), silver (Ag), nickel (Ni), tin (Sn), chrome (Cr), titanium nitride (TiN), tungsten nitride (WN), another metal nitride, and an oxidization-resistant conductive material.

The plurality of barrier layers may have hollow cylinder shapes that respectively surround outer surfaces of the plurality of absorption layers.

The synapse may include a core and a tunnel layer. The core may have a pillar shape. The tunnel layer may surround an outer surface of the core.

The core may include a perovskite-based material.

The tunnel layer may include one of a silicon oxide, a silicon nitride, or a combination thereof.

The plurality of gating lines may include at least three gating lines having different thicknesses.

The core may include oxygen, and the at least three gating lines may include an oxidizable metal.

The neuromorphic device may further include at least three absorption layers respectively disposed between the at least three gating lines and the synapse to surround portions of an outer surface of the synapse, Each of the at least three absorption layers may include an oxidizable metal.

The neuromorphic device may further include at least three barrier layers respectively disposed between the at least three gating lines and the at least three absorption layers. Each of the at least three barrier layers may include an oxidization-resistant metal.

In an embodiment, a neuromorphic device may include: a row line extending in a first direction; a column line disposed over the row line, the column line extending in a second direction perpendicular to the first direction; a synapse disposed between the row line and the column line, the synapse having a pillar shape; and a plurality of gating lines disposed between the row line and the column line, the plurality of gating line respectively surrounding portions of an outer surface of the synapse. The synapse may have a core and a tunnel layer. The core may include oxygen. The tunnel layer may surround an outer surface of the core and pass oxygen ions. The plurality of gating lines may extend to be parallel to at least one of the row line and the column line. The plurality of gating lines may have different thicknesses. Portions of the plurality of gating lines may be oxidizated by being coupled with the oxygen ions that passed through the tunnel layer from the core.

The plurality of gating lines comprises at least three gating lines.

The details of other embodiments are included in the detailed description and the drawings.

BRIEF DESCRIPTION OF THE DRAWINGS

FIGS. 1A to 1C are block diagrams conceptually illustrating neuromorphic devices in accordance with various embodiments of the present disclosure.

DETAILED DESCRIPTION

Figure 1B:
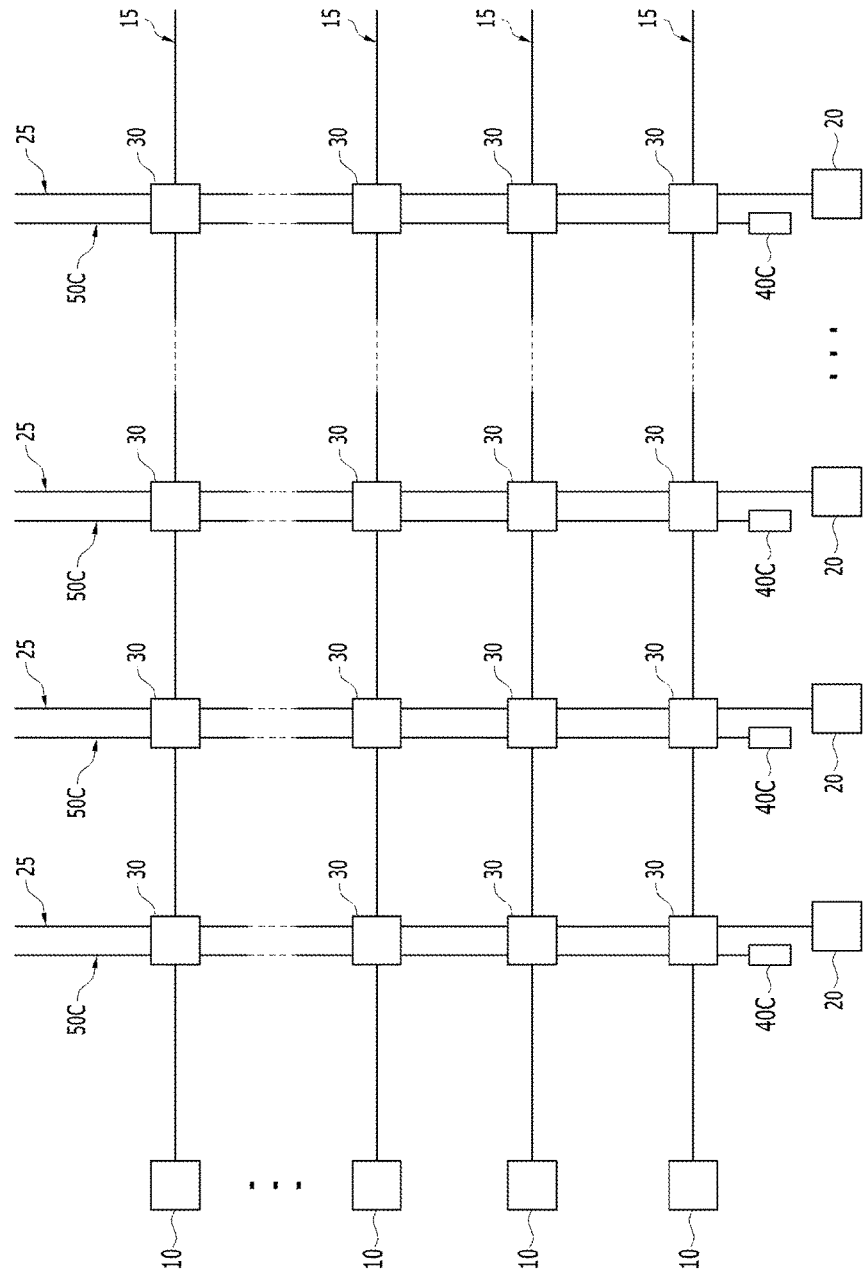

In the present disclosure, advantages, features, and methods for achieving them will become more apparent after a reading of the following exemplary embodiments taken in conjunction with the drawings. The invention may, however, be embodied in different forms and should not be construed as limited to the embodiments set forth herein. Rather, these embodiments are provided so that the present disclosure will be thorough and complete, and will fully convey the scope of the invention to those skilled in the art.

Terms used in this specification are used for describing various embodiments, and do not limit the invention. As used herein, a singular form is intended to include plural forms as well, unless the context clearly indicates otherwise. It will be further understood that the terms 'includes' and/or 'including,' when used in this specification, specify the presence of at least one stated feature, step, operation, and/or element, but do not preclude the presence or addition of one or more other features, steps, operations, and/or elements thereof.

When one element is referred to as being 'connected to' or 'coupled to' another element, it may indicate that the former element is directly connected or coupled to the latter element or another element is interposed therebetween. On the other hand, when one element is referred to as being 'directly connected to' or 'directly coupled to' another element, it may indicate that no element is interposed therebetween. Furthermore, 'and/or' includes each of described items and one or more combinations.

The terms such as 'below,' 'beneath,' 'lower,' 'above,' and 'upper,' which are spatially relative terms, may be used to describe the correlation between one element or components and another element or other components, as illustrated in the drawings. The spatially relative terms should be understood as terms including different directions of elements during the use or operation, in addition to the directions illustrated in the drawings. For example, when an element illustrated in a drawing is turned over, the element which is referred to as being 'below' or 'beneath' another element may be positioned above another element.

Moreover, various embodiments of this specification will be described with reference to cross-sectional views and/or plan views which are ideal exemplary diagrams of the invention. In the drawings, the dimensions of layers and regions may be exaggerated for clarity of illustration. As such, variations from the shapes of the illustrations as a result, for example, of manufacturing techniques and/or tolerances, are to be expected. Thus, embodiments of the disclosure should not be construed as limited to the particular shapes illustrated herein but are to include deviations in shapes that result, for example, from manufacturing processes. For example, an angled region may have a round shape or a certain curvature. Thus, the regions illustrated in the figures are schematic in nature and their shapes are not intended to illustrate the actual shape of a region of a device and are not intended to limit the scope of the invention.

Throughout the specification, like reference numerals refer to like elements. Therefore, although the same or similar reference numerals are not mentioned or described in a corresponding drawing, the reference numerals may be described with reference to other drawings. Furthermore, although elements are not represented by reference numerals, the elements may be described with reference to other drawings.

In this specification, 'potentiation,' 'set,' 'learning,' and 'training' may be used as the same or similar terms, and 'depressing,' 'reset,' and 'initiation' may be used as the same or similar terms. For example, an operation of lowering resistance values of synapses may be exemplified as potentiation, setting, learning, or training; and an operation of raising resistance values of synapses may be exemplified as depressing, resetting, or initiation. Furthermore, when a synapse is potentiated, set, or trained, a gradually increasing voltage/current may be outputted from the synapse because the conductivity of the synapse is increasing. When a synapse is depressed, reset, or initiated, a gradually decreasing voltage/current may be outputted from the synapse because the conductivity of the synapse is decreasing. For convenience of description, a data pattern, an electrical signal, a pulse, a spike, and a firing may be interpreted as having the same, similar, or a compatible meaning. Furthermore, a voltage and a current may also be interpreted as having the same or a compatible meaning.

Figure 1C:
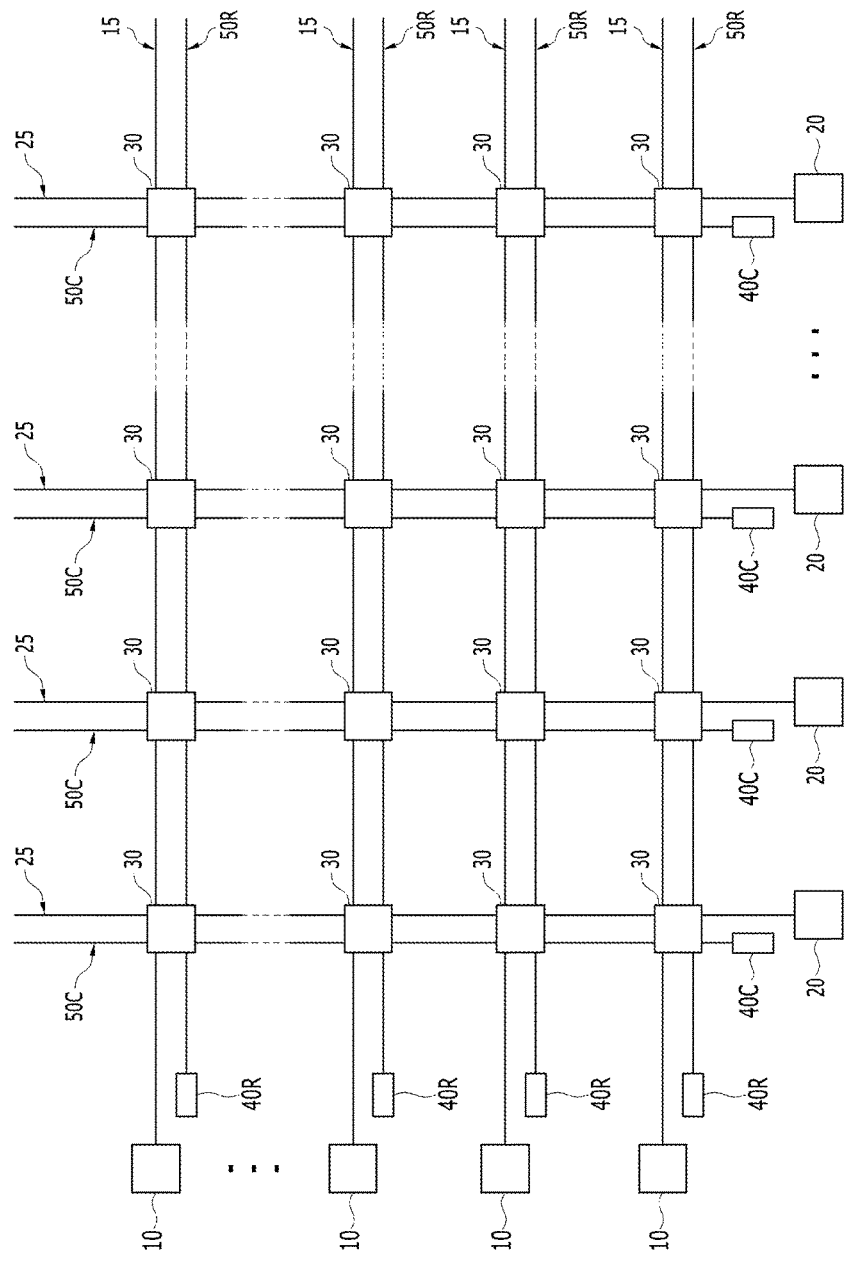

FIGS. 1A to 1C are block diagrams conceptually illustrating neuromorphic devices in accordance with various embodiments of the present disclosure.

Referring to FIG. 1A, a neuromorphic device may include pre-synaptic neurons 10, row lines 15, post-synaptic neurons 20, column lines 25, synapses 30, row gating controllers 40R, and row gating lines 50R. The row lines 15 and the row gating lines 50R may be arranged in parallel with each other.

The pre-synaptic neurons 10 may transmit electrical signals to the synapses 30 through the row lines 15 in a learning mode, a reset mode, or a reading mode.

The post-synaptic neurons 20 may transmit electrical signals to the synapses 30 through the column lines 25 in the learning mode or the reset mode, and may receive electrical signals from the synapses 30 through the column lines 25 in the reading mode.

The respective row lines 15 may extend from the respective pre-synaptic neurons 10 in a row direction, and may be electrically coupled to the synapses 30.

The respective column lines 25 may extend from the respective post-synaptic neurons 20 in a column direction, and may be electrically coupled to the synapses 30.

The row gating controllers 40R may provide gating signals to the synapses 30 through the row gating lines 50R.

The respective row gating lines 50R may extend from the respective row gating controllers 40R in the row direction, and may be electrically coupled to the synapses 30.

The synapses 30 may be disposed at intersections of the row lines 15 and the column lines 25. Synapses 30 which share the same row line 15 may share the same row gating line 50R.

Referring to FIG. 1B, a neuromorphic device may include pre-synaptic neurons 10, row lines 15, post-synaptic neurons 20, column lines 25, synapses 30, column gating controllers 40C, and column gating lines 50C. The column gating controllers 40C may provide gating signals to the synapses 30 through the column gating lines 50C. The respective column gating lines 50C may extend from the respective column gating controllers 40C in a column direction, and may be electrically coupled to the synapses 30. Synapses 30 that share the same column line 25 may also share the same column gating line 50C.

Referring to FIG. 1C, a neuromorphic device may include pre-synaptic neurons 10, row lines 15, post-synaptic neurons 20, column lines 25, synapses 30, row gating controllers 40R, column gating controllers 40C, row gating lines 50R, and column gating lines 50C. The row gating controllers 40R may provide gating signals to the synapses 30 through the row gating lines 50R, and the column gating controllers 40C may provide gating signals to the synapses 30 through the column gating lines 50C. The synapses 30 that share the same row line 15 may also share the same row gating line 50R. Synapses 30 that share the same column line 25 may also share the same column gating line 50C. That is to say, each of the synapses 30 may be electrically coupled to a corresponding one of the row lines 15, a corresponding one of the column lines 25, a corresponding one of the row gating lines 50R, and a corresponding one of the column gating lines 50C.

FIGS. 2A to 2D are perspective views conceptually illustrating synapse systems of neuromorphic devices in accordance with various embodiments of the present disclosure.

Figure 2A:
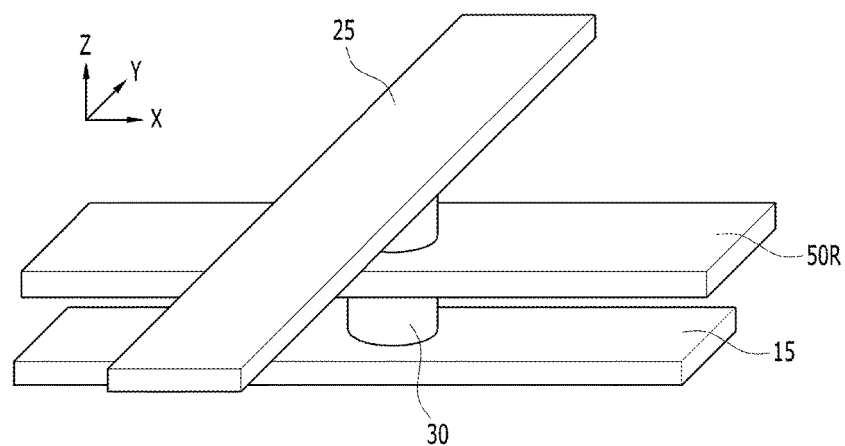
FIGS. 2A to 2D are perspective views conceptually illustrating synapse systems of neuromorphic devices in accordance with various embodiments of of the present disclosure.

Referring to FIG. 2A, a synapse system of a neuromorphic device may include a row line 15, a column line 25, a synapse 30, and a row gating line 50R. The row line 15 may have a line shape and extend in a row direction. The row gating line 50R may have a line shape, may extend in the row direction, and may be disposed above the row line 15 to be in parallel with the row line 15. The column line 25 may have a line shape, may extend in a column direction perpendicular to the row direction, and may be disposed above the row line 15 and the row gating line 50R. The synapse 30 may be disposed between the row line 15 and the column line 25. In FIG. 2A, the row direction may correspond to an X-axis direction, and the column direction may correspond to a Y-axis direction.

In a top view, the synapse 30 may be disposed at an intersection of the row line 15 and the column line 25. That is, the synapse 30 may be disposed in an intersection region between the row line 15 and the column line 25. A bottom end of the synapse 30 may directly contact the row line 15, and a top end of the synapse 30 may directly contact the column line 25. The synapse 30 may pass through the row gating line 50R in a Z-axis direction. Thus, the row gating line 50R may surround a side surface, i.e., a sidewall, of the synapse 30. In another embodiment of the present disclosure, positions of the row line 15 and the column line 25 may be changed with each other. That is, the row line 15 may be disposed over the row gating line 50R and the column line 25.

Figure 2B:
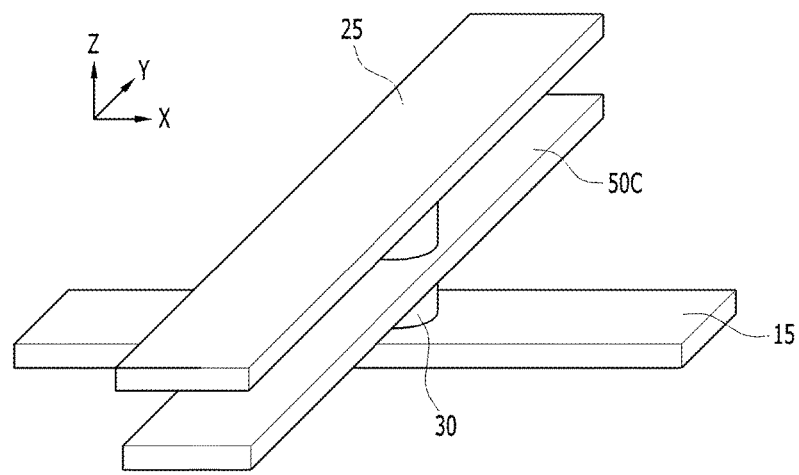

Referring to FIG. 2B, a synapse system of a neuromorphic device may include a row line 15 that extends in a row direction, a column line 25 that extends in a column direction, a synapse 30, and a column gating line 50C that extends in the column direction. The column gating line 50C may have a line shape, may extends in the column direction, and may be disposed above the row line 15 and below the column line 25 to be in parallel with the column line 25. The synapse 30 may pass through the column gating line 50C, and thus the column gating line 50C may surround a side surface, i.e., a sidewall, of the synapse 30.

Figure 2C:
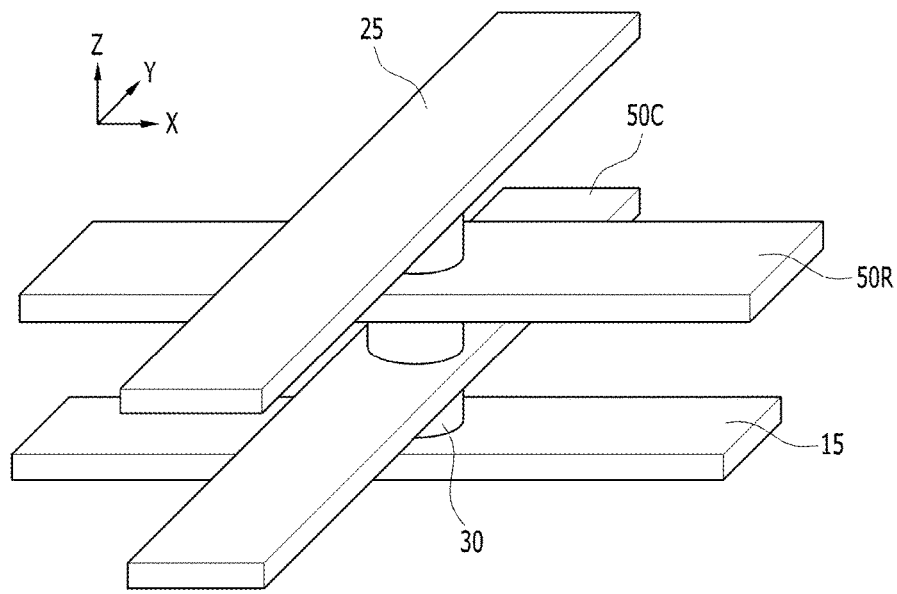

Referring to FIG. 2C, a synapse system of a neuromorphic device may include a row line 15 extending in a row direction, a column line 25 extending in a column direction, a synapse 30, a row gating line 50R extending in the row direction, and a column gating line 50C extending in the column direction. The row gating line 50R and the column gating line 50C are disposed between the row line 15 and the column line 25. The row gating line 50R may be disposed above the column gating line 50C. In other words, the row line 15 extending in the row direction, the column gating line 50C extending in the column direction, the row gating line 50R extending in the row direction, and the column line 25 extending in the column direction may be sequentially stacked. The synapse 30 may pass through the row gating line 50R and the column gating line 50C between the row line 15 and the column line 25, and thus the row gating line 50R and the column gating line 50C may surround a side surface, i.e., a sidewall, of the synapse 30.

Figure 2D:
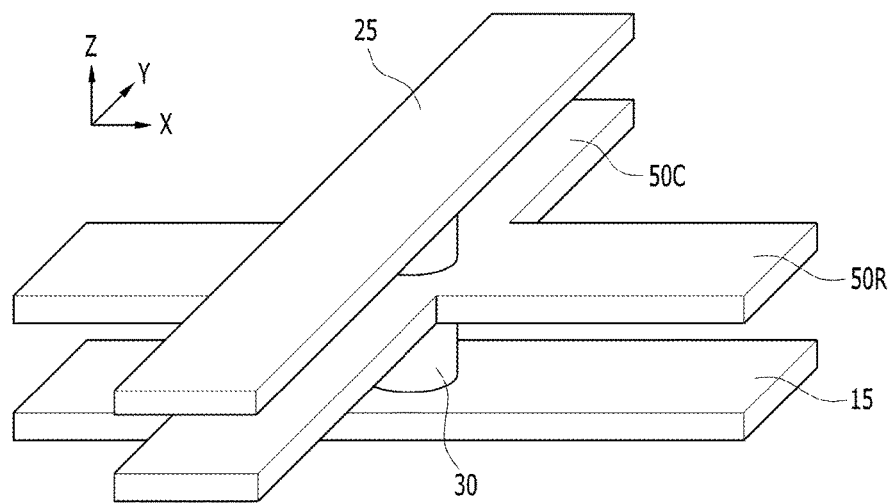

Referring to FIG. 2D, a synapse system of a neuromorphic device may include a row line 15 extending in a row direction, a column line 25 extending in a column direction, a synapse 30, a row gating line 50R extending in the row direction, and a column gating line 50C extending in the column direction. The row gating line 50R and the column gating line 50C may be electrically coupled to each other and disposed at the same level. In an embodiment, the row gating line 50R and the column gating line 50C may be formed using the same layer.

Figure 3A:
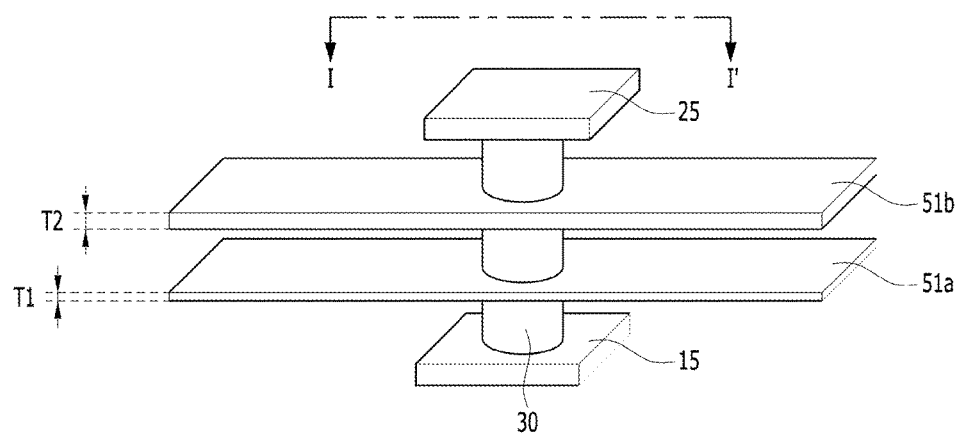
FIG. 3A is a perspective view illustrating a synapse system of a neuromorphic device in accordance with an embodiment of the present disclosure.
Figure 3B:
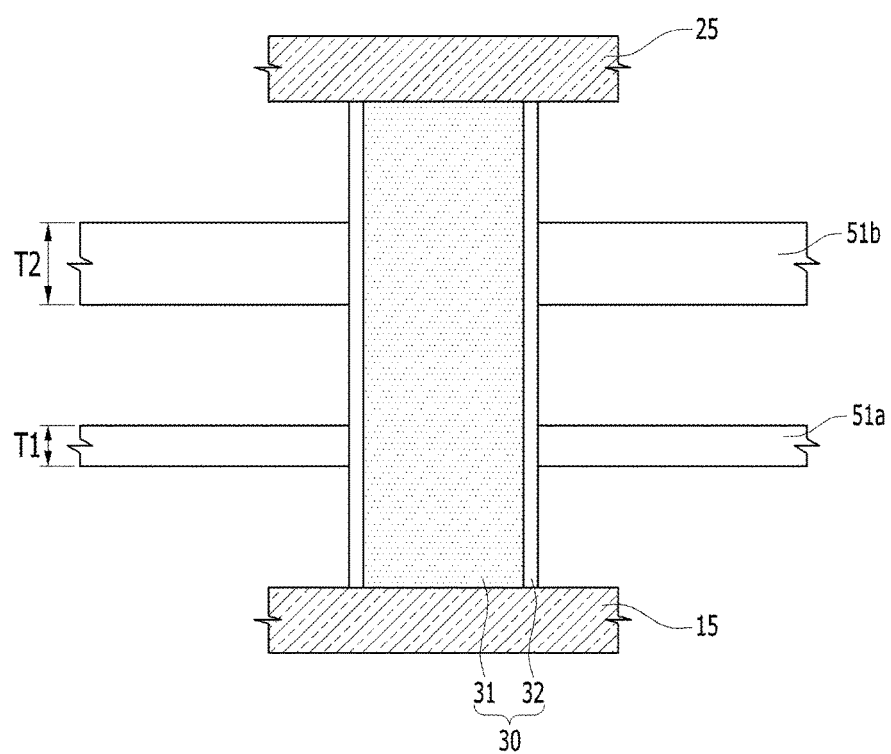
FIG. 3B is a cross-sectional view taken along line I-I' of FIG. 3A.

FIG. 3A is a perspective view illustrating a synapse system of a neuromorphic device in accordance with an embodiment, and FIG. 3B is a cross-sectional view taken along line I-I' of FIG. 3A.

Referring to FIGS. 3A and 3B, the synapse system includes a row line 15, first and second gating lines 51a and 51b that are disposed above the row line 15, a column line 25 disposed above the first and second gating lines 51a and 51b, and a synapse 30 that is disposed between the row line 15 and the column line 25 and that passes through the first and second gating lines 51a and 51b. The first and second gating lines 51a and 51b may surround a side surface, i.e., a sidewall, of the synapse 30.

Referring to FIG. 3B, the synapse 30 may include a core 31 and a tunnel layer 32 surrounding the core 31; the core 31 may have a pillar shape, the tunnel layer 32 may have a cylinder shape. That is, the tunnel layer 32 may surround an outer surface of the core 31. The first and second gating lines 51a and 51b may be arranged to be parallel to the row line 15, or the column line 25, or both. In FIGS. 3A and 3B, the first and second gating lines 51a and 51b extend in the same direction, but embodiments are not limited thereto. In another embodiment, the first gating line 51a may cross the second gating line 51b. Therefore, the first and second gating lines 51a and 51b may include any one of, or may be both of, the row gating line 50R and the column gating line 50C of FIGS. 2A to 2D. Positions of the first gating line 51a and the second gating line 51b may be changed with each other. The first and second gating lines 51a and 51b may have a first thickness T1 and a second thickness T2, respectively, that are different from each other. For example, the second thickness T2 may be equal to an integer times the first thickness T1. In an embodiment, the second thickness T2 is two times the first thickness T1.

Each of the row line 15 and the column line 25 may include one or more of tungsten (W), tungsten nitride (WN), copper (Cu), titanium nitride (TiN), an inoxidizable metal, and an inoxidizable metal compound.

The first and second gating lines 51a and 51b may include a metal capable of being partially oxidized by being coupled with oxygen ions. The metal may include any of aluminum (Al), titanium (Ti), hafnium (Hf), zirconium (Zr), lanthanum (La), niobium (Nb), yttrium (Y), strontium (Sr), and another oxidizable metal.

The core 31 of the synapse 30 may include a metal oxide layer, which includes movable oxygen ions. For example, the core 31 may include a perovskite-based material (such as $Pr_xCa_yMnO_3$ or PCMO) (x and y are positive numbers and, for example, x+y=1). The tunnel layer 32 may include at least one of a silicon oxide, a silicon nitride, or another dielectric material.

Figure 3C:
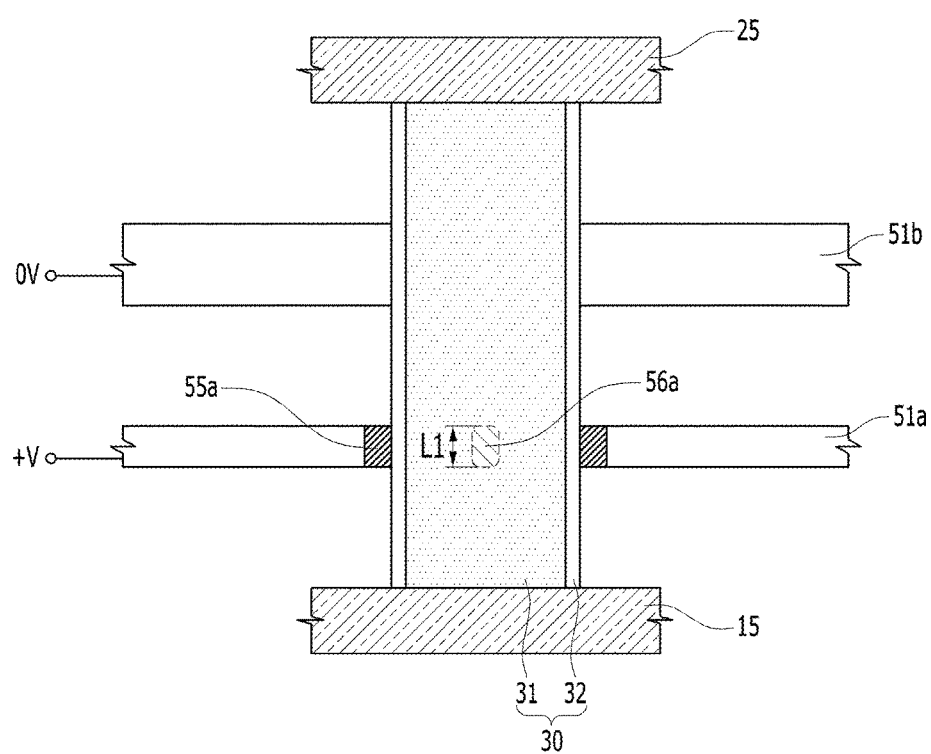
FIGS. 3C to 3E are views illustrating an operation of a synapse system of a neuromorphic device in accordance with an embodiment of the present disclosure.
Figure 3D:
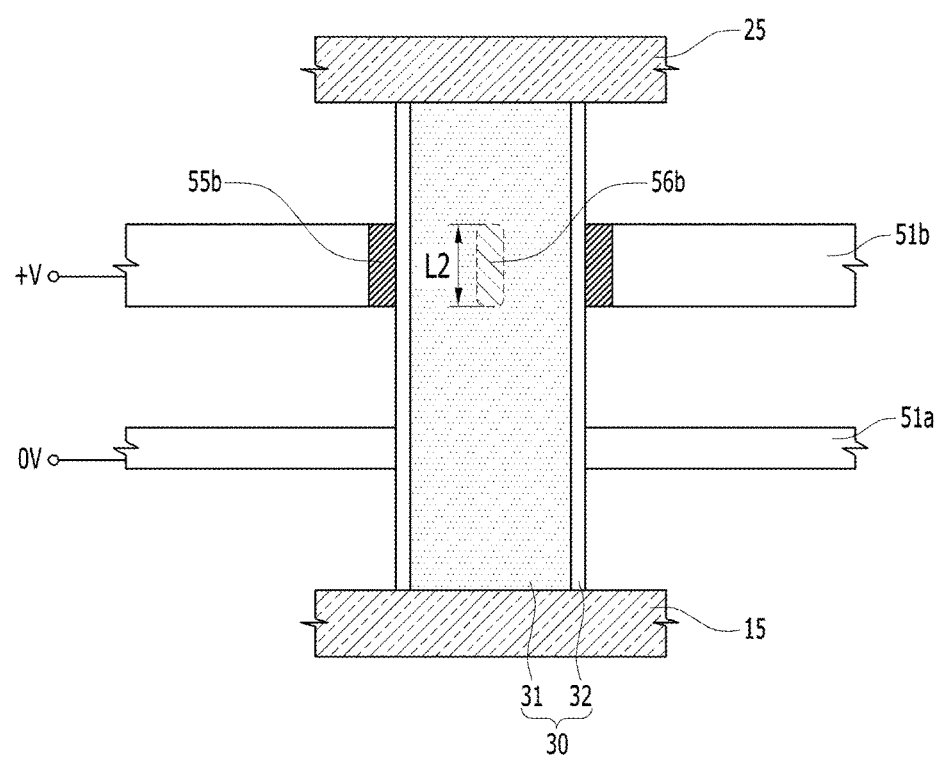
Figure 3E:
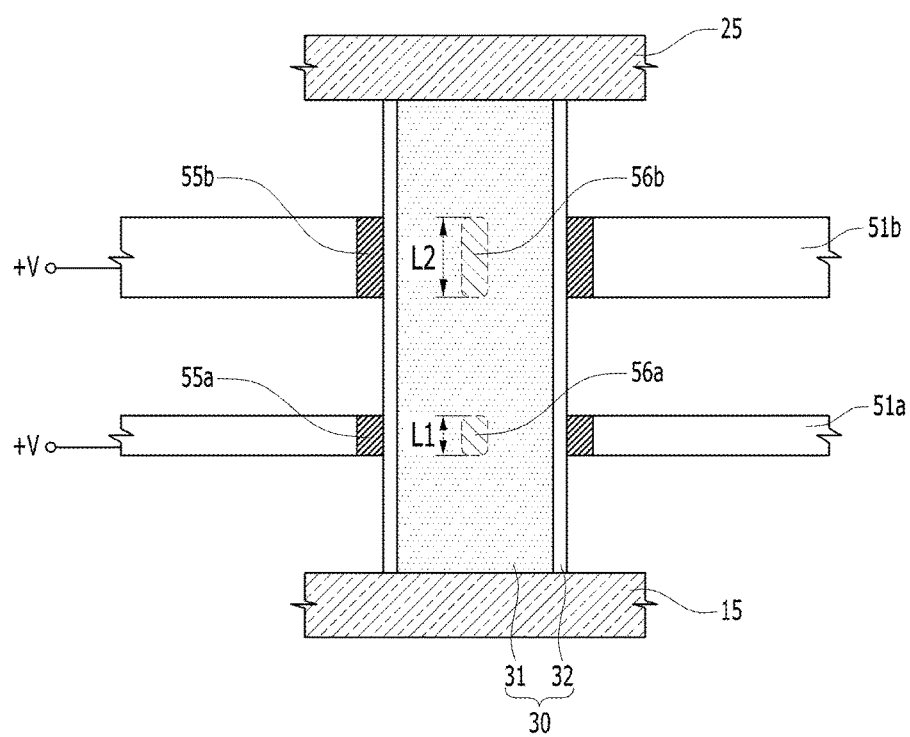

FIGS. 3C to 3E are views illustrating an operation of the synapse system of the neuromorphic device shown in FIG. 3B. For example, in the synapse system of the neuromorphic device shown in FIG. 3B, a 0 (zero) or positive (+) voltage may be applied selectively to the first and second gating lines 51a and 51b. As mentioned above, the first and second gating lines 51a and 51b may collectively be any one or both of the row gating line 50R and the column gating line 50C shown in FIGS. 2A to 2D. Namely, both the first and second gating lines 51a and 51b may collectively be either the row gating line 50R or the column gating line 50C, or the first and second gating lines 51a and 51b may respectively be the row gating line 50R and the column gating line 50C, or may respectively be the column gating line 50C and the row gating line 50R.

Referring to FIG. 3C, when a positive (+) voltage is applied to the first gating line 51a and no voltage, e.g., a zero voltage, is applied to the second gating line 51b, a portion of the first gating line 51a may be converted into a first oxidized layer 55a, and a first channel 56a may be formed in the core 31 of the synapse 30. For example, when the positive (+) voltage is applied to the first gating line 51a, oxygen ions ($O^-$) included in the core 31 of the synapse 30 may move to the first gating line 51a through the tunnel layer 32. Accordingly, the first oxidized layer 55a may be formed in the portion of the first gating line 51a that is adjacent to the tunnel layer 32. The first oxidized layer 55a may have a hollow cylinder shape that serves as a rim surrounding the outer surface of the synapse 30. The first channel 56a may be formed at a central portion of the core 31. The first channel 56a may be formed due to an oxygen ion deficiency phenomenon occurring when the oxygen ions ($O^-$) in the core 31 pass through the tunnel layer 32 and move to the first gating line 51a by an electric field induced by the first gating line 51a that surrounds the core 31. That is to say, the electrical conductivity of the first channel 56a may be changed when the first oxidized layer 55a is formed since the first channel 56a is deficient in oxygen ions ($O^-$). For example, when the core 31 includes an N-type material and the positive (+) voltage is applied to the first gating line 51a, an electrical resistance value of the first channel 56a may decrease, and thus the electrical conductivity of the first channel 56a may increase. Conversely, when the core 31 includes a P-type material and the positive (+) voltage is applied to the first gating line 51a, the electrical resistance value of the first channel 56a may increase, and thus the electrical conductivity of the first channel 56a may decrease.

In the following descriptions, it is assumed that the core 31 includes the N-type material. The first channel 56a may have a vertical length L1 corresponding to the vertical thickness T1 of the first gating line 51a. A horizontal width of the first channel 56a may be changed depending on the magnitude of the voltage applied to the first gating line 51a. Due to the first channel 56a formed in the core 31, the electrical resistance value of the core 31 of the synapse 30 may decrease.

Referring to FIG. 3D, when a positive (+) voltage is applied to the second gating line 51b and no substantial voltage, e.g., a zero voltage, is applied to the first gating line 51a, a portion of the second gating line 51b may be converted into a second oxidized layer 55b, and a second channel 56b may be formed in the core 31 of the synapse 30. The second channel 56b may have a vertical length L2 corresponding to the vertical thickness T2 of the second gating line 51b. When referring back to FIGS. 3A and 3B, since the vertical thickness T2 of the second gating line 51b is two times the vertical thickness T1 of the first gating line 51a, the vertical length L2 of the second channel 56b may be two times the vertical length L1 of the first channel 56a. Accordingly, as the second channel 56b is formed in the core 31, the electrical resistance value of the core 31 of the synapse 30 may further decrease compared to when the first channel 56a is disposed in the core 31.

Referring to FIG. 3E, when a positive (+) voltage is applied to both the first and second gating lines 51a and 51b, portions of the first and second gating lines 51a and 51b may be respectively converted into first and second oxidized layers 55a and 55b, and first and second channels 56a and 56b may be formed in the core 31 of the synapse 30. Accordingly, the electrical resistance value of the core 31 of the synapse 30 may additionally decrease compared to when one of the first and second channels 56a and 56b is disposed in the core 31.

Referring to FIGS. 3B to 3E, the core 31 may have four resistance states. In other words, the lengths of the first and second channels 56a and 56b formed in the core 31 may form four combinations of 0 (zero), L1, L2, and L3 (wherein L3=L+L2). Therefore, the synapse 30 in accordance with the embodiment of the present disclosure may have multi-bit storage capability according to the four resistance states. As summarized in the following Table 1, when a positive (+) voltage is applied selectively to the first and second gating lines 51a and 51b, the first and second channels 56a and 56b are selectively formed in the core, and thus the core 31 may have four resistance levels Level 0 to Level 3.

TABLE 1

| Resistance Level | First Gating Line | Second Gating Line |
|---|---|---|
| Level 0 | Off | Off |
| Level 1 | On | Off |
| Level 2 | Off | On |
| Level 3 | On | On |

In the synapse system described above with reference to FIGS. 3C to 3E, the first and second oxidized layers 55a and 55b may be reduced or may disappear by applying a negative (−) voltage to the first and second gating lines 51a and 51b. For example, when the negative (−) voltage is applied to the first and second gating lines 51a and 51b, oxygen ions in the oxidized layers 55a and 55b may move to the core 31 of the synapse 30. Thus, the synapse 30 may be reset.

Figure 3F:
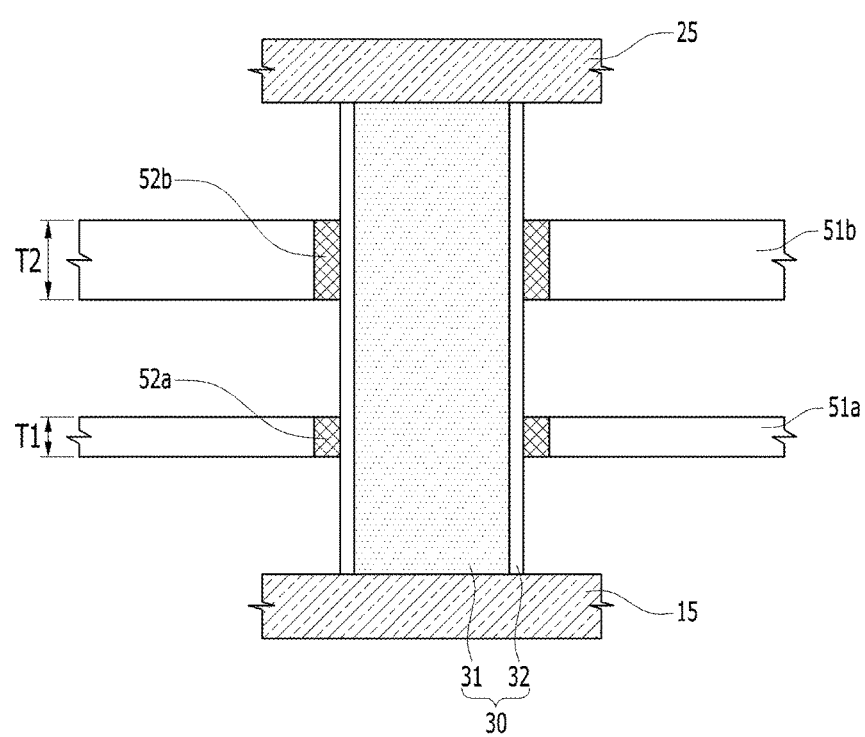
FIGS. 3F and 3G are r views illustrating a structure and an operation of a synapse system of a neuromorphic device in accordance with an embodiment of the present disclosure.
Figure 3G:
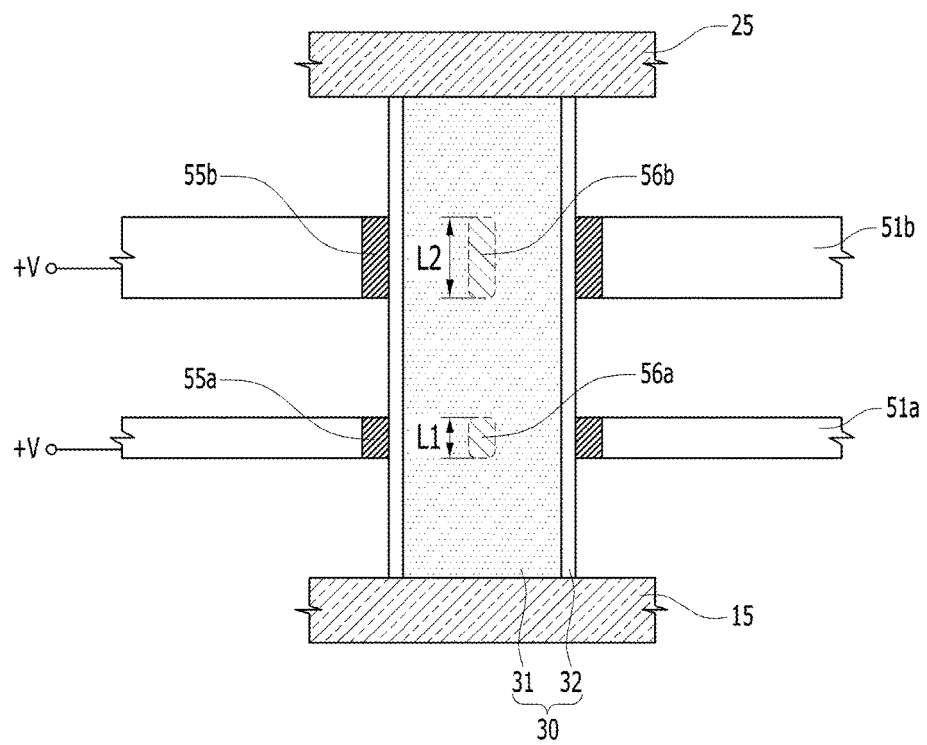

FIGS. 3F and 3G are views illustrating a structure and an operation of a synapse system of a neuromorphic device in accordance with an embodiment of the present disclosure.

In addition to the structures of the synapse system shown in FIG. 3B, the synapse system shown in FIG. 3F may further include first and second absorption layers 52a and 52b. The first absorption layer 52a may be formed between the first gating line 51a and the synapse 30, and the second absorption layer 52b may be formed between the second gating line 51b and the synapse 30. That is, each of the first and second absorption layers 52a and 52b may have a hollow cylinder shape, and may serve as a rim that surrounds the outer surface of the synapse 30. The first and second absorption layers 52a and 52b may absorb oxygen ions that move from the core 31 of the synapse 30. In other words, the first and second absorption layers 52a and 52b may be easily oxidized. For example, each of the first and second absorption layers 52a and 52b may include one or more of aluminum (Al), titanium (Ti), hafnium (Hf), zirconium (Zr), lanthanum (La), niobium (Nb), yttrium (Y), strontium (Sr), and another oxidizable metal. Each of the first and second gating lines 51a and 51b may include one or more of gold (Au), platinum (Pt), silver (Ag), nickel (Ni), tin (Sn), chrome (Cr), titanium nitride (TiN), tungsten nitride (WN), a conductive metal nitride, and an oxidization-resistant conductive material, which are not easily oxidized.

Referring to FIG. 3G, when a positive (+) voltage is applied to the first and second gating lines 51a and 51b, oxygen ions in the core 31 of the synapse 30 may move to the first and second absorption layers 52a and 52b through the tunnel layer 32. Accordingly, the first and second absorption layers 52a and 52b may be converted into first and second oxidized layers 55a and 55b, respectively. First and second channels 56a and 56b may be formed in the core 31 of the synapse 30. When referring additionally to FIGS. 3C and 3D and Table 1, the core 31 of the synapse 30 in accordance with this embodiment may also have four resistance states, similar to those of the embodiment shown in FIG. 3B, according to selective voltage applications to the first and second gating lines 51a and 51b.

Figure 3H:
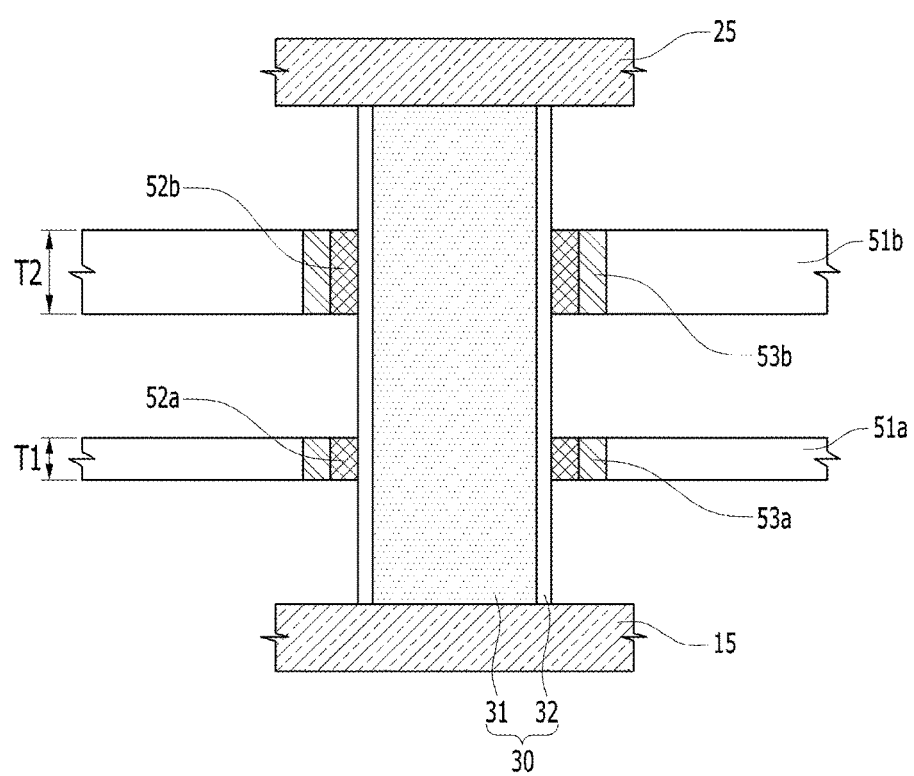
FIGS. 3H and 3I are views illustrating a structure and an operation of a synapse system of a neuromorphic device in accordance with an embodiment of the present disclosure.
Figure 3I:
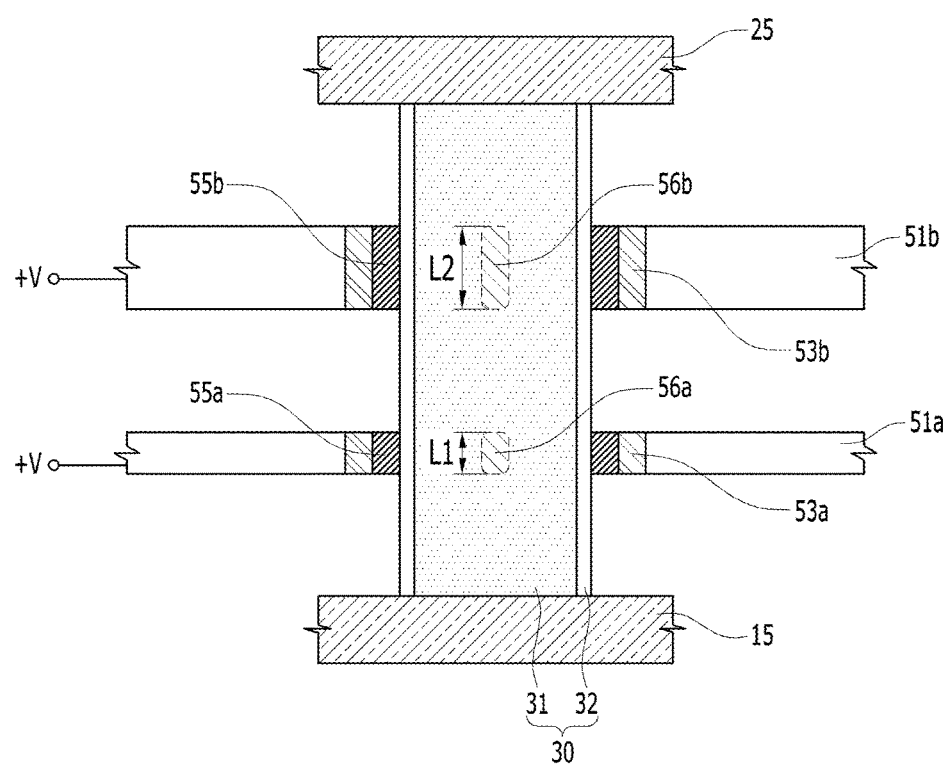

FIGS. 3H and 3I are views illustrating a structure and an operation of a synapse system of a neuromorphic device in accordance with an embodiment of the present disclosure. In addition to the structure of the synapse system shown in FIG. 3F, the synapse system of the neuromorphic device shown in FIG. 3H may further include a first barrier layer 53a formed between the first gating line 51a and the first absorption layer 52a, and a second barrier layer 53b formed between the second gating line 51b and the second absorption layer 52b. The first and second barrier layers 53a and 53b may have hollow cylinder shapes that surround outer surfaces of the first and second absorption layers 52a and 52b, respectively. The first and second barrier layers 53a and 53b may block oxygen ions, which have moved from the core 31 of the synapse 30, from diffusing or moving to the first and second gating lines 51a and 51b, respectively. Therefore, the oxygen ions moved from the core 31 of the synapse 30 may only oxidize the first and second absorption layers 52a and 52b without oxidizing the first and second gating lines 51a and 51b. Each of the first and second barrier layers 53a and 53b may include one or more of gold (Au), platinum (Pt), silver (Ag), nickel (Ni), tin (Sn), chrome (Cr), titanium nitride (TiN), tungsten nitride (WN), a metal nitride, and an oxidization-resistant conductive material.

Referring to FIG. 3I, when a positive (+) voltage is applied to the first and second gating lines 51a and 51b, oxygen ions in the core 31 of the synapse 30 may move to the first and second absorption layers 52a and 52b through the tunnel layer 32. Accordingly, the first and second absorption layers 52a and 52b may be converted into first and second oxidized layers 55a and 55b, respectively. First and second channels 56a and 56b may be formed in the core 31 of the synapse 30. Because the oxygen ions are prevented from diffusing or moving to the first and second gating lines 51a and 51b by the first and second barrier layers 53a and 53b, the first and second gating lines 51a and 51b may not be oxidized. When referring additionally to FIGS. 3C and 3D and Table 1, the core 31 of the synapse 30 in accordance with this embodiment may also have four resistance states, similar to those of the embodiment shown in FIG. 3B, according to selective voltage applications to the first and second gating lines 51a and 51b.

Figure 4A:
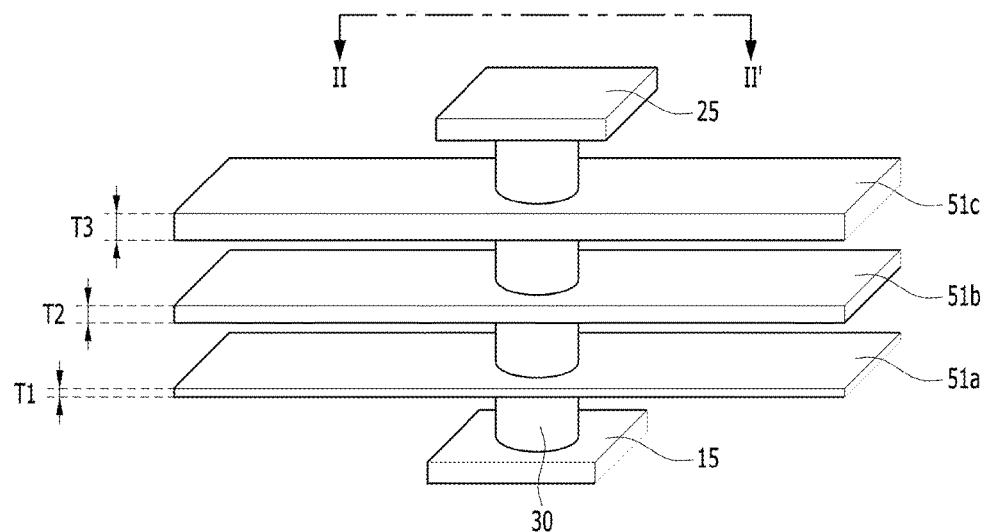
FIG. 4A is a perspective view illustrating a synapse system of a neuromorphic device in accordance with an embodiment of the present disclosure.
Figure 4B:
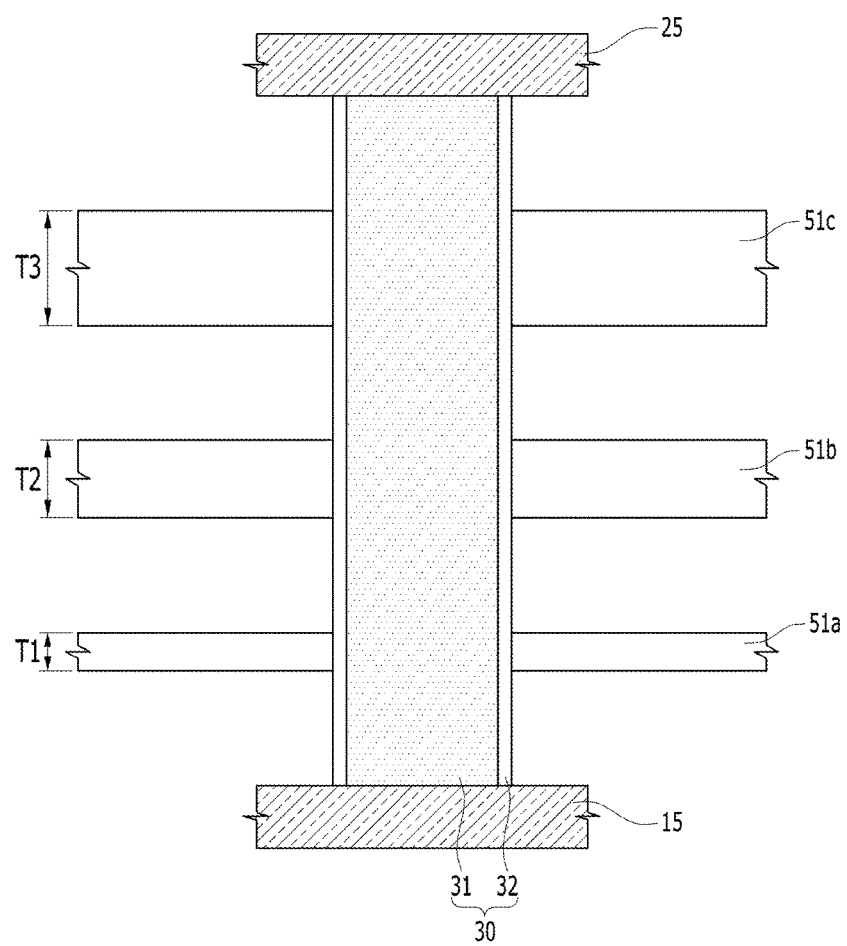
FIG. 4B is a cross-sectional view taken along line II-II' of FIG. 4A.

FIG. 4A is a perspective view illustrating a synapse system of a neuromorphic device in accordance with an embodiment of the present disclosure, and FIG. 4B is a cross-sectional view taken along line II-II' of FIG. 4A.

Referring to FIGS. 4A and 4B, the synapse system of the neuromorphic device may include a row line 15, a column line 25, first to third gating lines 51a to 51c disposed between the row line 15 and the column line 25, and a synapse 30 that passes through the first to third gating lines 51a to 51c.

The first to third gating lines 51a to 51c may have different thicknesses T1, T2, and T3, respectively. For example, the second and third thicknesses T2 and T3 may be equal to an integer times the first thickness T1. In an embodiment, the second thickness T2 is equal to two times the first thickness T1, and the third thickness T3 is equal to three times the first thickness T1. Positions of the first to third gating lines 51a to 51c may be changed with one another in accordance with various embodiments.

Figure 4C:
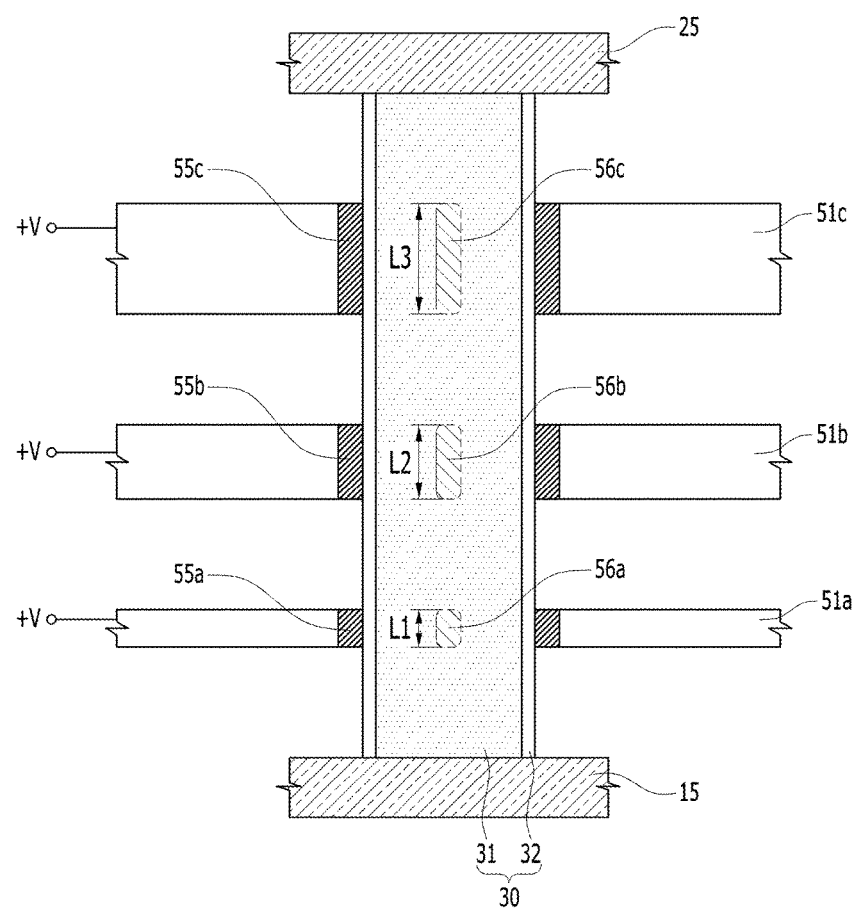
FIG. 4C is a view illustrating an operation of a synapse system of a neuromorphic device in accordance with an embodiment of the present disclosure.

FIG. 4C is a view illustrating an operation of the synapse system of the neuromorphic device shown in FIGS. 4A and 4B. Referring to FIG. 4C, when a positive (+) voltage is applied to the first to third gating lines 51a to 51c, first to third oxidized layers 55a to 55c may be respectively formed in portions of the first to third gating lines 51a to 51c that are adjacent to a tunnel layer 32, and thus first to third channels 56a to 56c may be formed in a core 31. Vertical lengths L1 to L3 of the first to third channels 56a to 56c may correspond to the vertical thicknesses T1 to T3 of the first to third gating lines 51a to 51c, respectively. For example, the first channel 56a may have the first vertical length L1, the second channel 56b may have the second vertical length L2 that is two times the first vertical length L1, and the third channel 56c may have the third vertical length L3 that is three times the first vertical length L1.

In another embodiment of the present disclosure, a positive (+) voltage may be applied selectively to the first to third gating lines 51a to 51c. Thus, the first to third oxidized layers 55a to 55c and the first to third channels 56a to 56c may be formed selectively. The first to third channels 56a to 56c may be selectively formed to have a total vertical length corresponding to one of eight combinations of 0 (zero), L1, L2, L3, L1+L2, L1+L3, L2+L3, and L1+L2+L3. In this embodiment, since L3=L1+L2, the core 31 may have seven resistance levels. As summarized in the following Table 2, when the positive (+) voltage is applied selectively to the first to third gating lines 51a to 51c, the first to third channels 56a to 56c are formed selectively, and thus the core 31 may have seven resistance levels Level 0 to Level 6.

TABLE 2

| Resistance Level | First Gating Line | Second Gating Line | Third Gating Line |
| --- | --- | --- | --- |
| Level 0 | Off | Off | Off |
| Level 1 | On | Off | Off |
| Level 2 | Off | On | Off |
| Level 3 | Off | Off | On |
|  | On | On | Off |
| Level 4 | On | Off | On |
| Level 5 | Off | On | On |
| Level 6 | On | On | On |

Figure 4D:
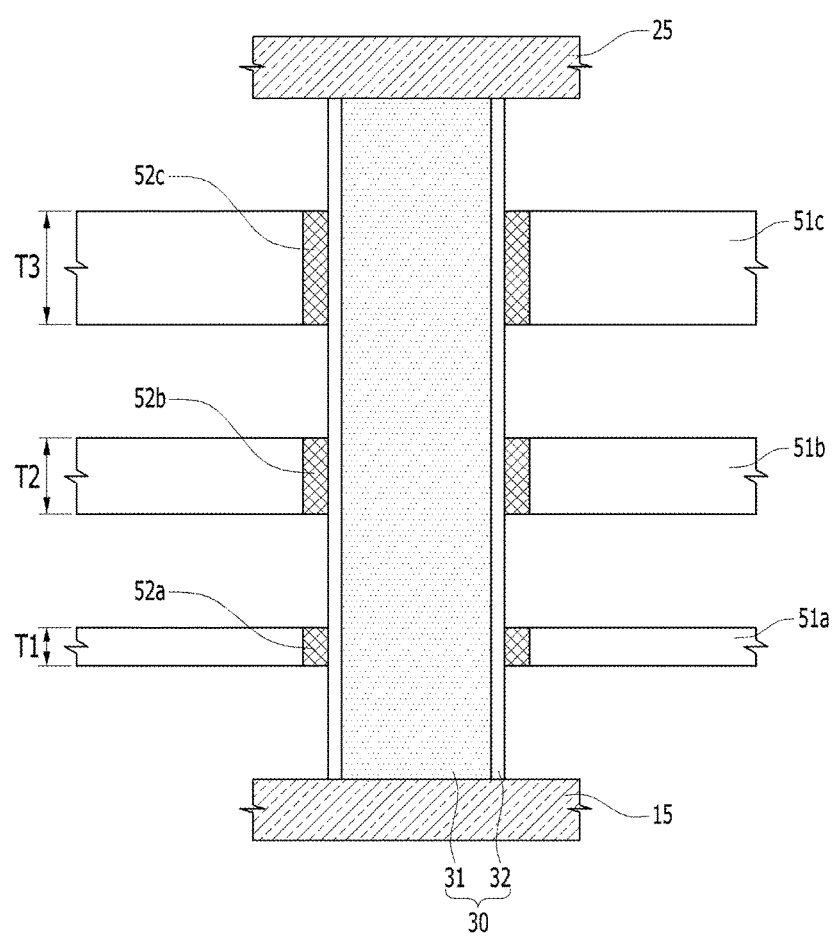
FIGS. 4D and 4E are r views illustrating a structure and an operation of a synapse system of a neuromorphic device in accordance with an embodiment of the present disclosure.
Figure 4E:
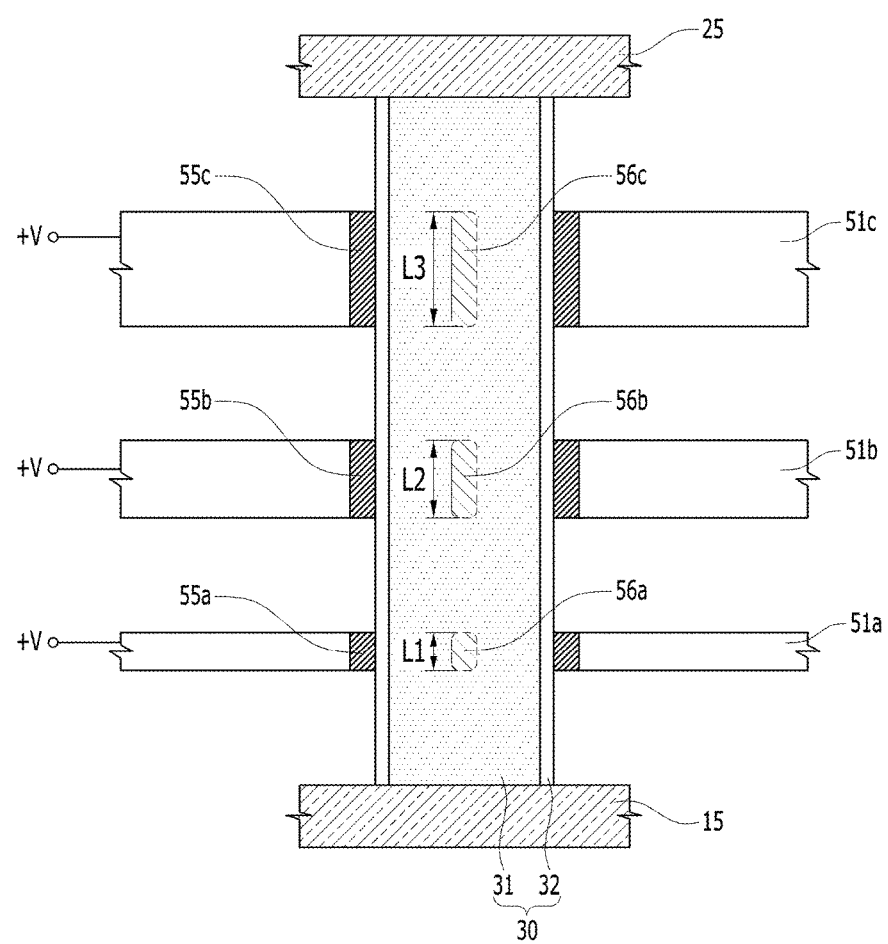

FIGS. 4D and 4E are views illustrating a structure and an operation of a synapse system of a neuromorphic device in accordance with an embodiment of the present disclosure. In addition to the structure of the synapse system shown in FIG. 4B, the synapse system of the neuromorphic device shown in FIG. 4D may further include first to third absorption layers 52a to 52c, which are respectively formed between the first to third gating lines 51a to 51c and the synapse 30. The descriptions for this embodiment may be understood with reference to FIG. 3F.

Referring to FIG. 4E, when a positive (+) voltage is applied to the first to third gating lines 51a to 51c, oxygen ions in the core 31 of the synapse 30 may move to the first to third absorption layers 52a to 52c through the tunnel layer 32. Accordingly, the first to third absorption layers 52a to 52c may be converted into first to third oxidized layers 55a to 55c, respectively. Thus, first to third channels 56a to 56c may be formed in the core 31 of the synapse 30. Vertical lengths L1, L2, and L3 of the first to third channels 56a to 56c may correspond to the vertical thicknesses T1 to T3 of the first to third gating lines 51a to 51c, respectively. By referring additionally to FIGS. 3C and 3D, the positive (+) voltage may be applied selectively to the first to third gating lines 51a to 51c.

Figure 4F:
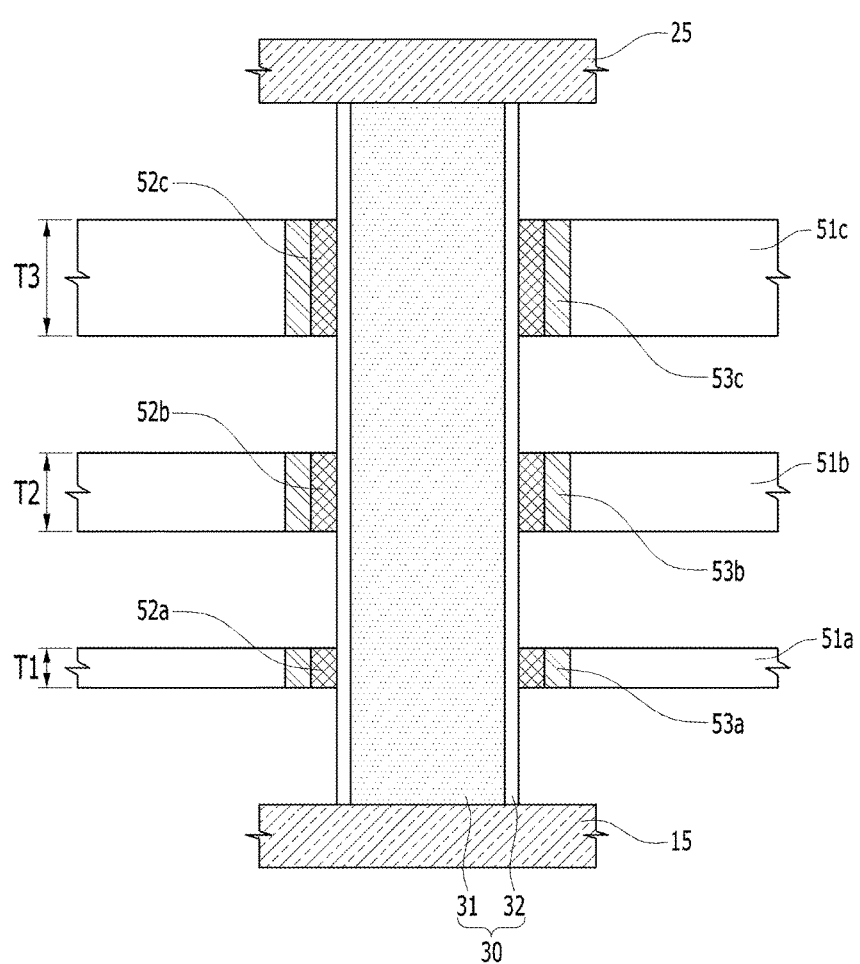
FIGS. 4F and 4G are views illustrating a structure and an operation of a synapse system of a neuromorphic device in accordance with an embodiment of the present disclosure.
Figure 4G:
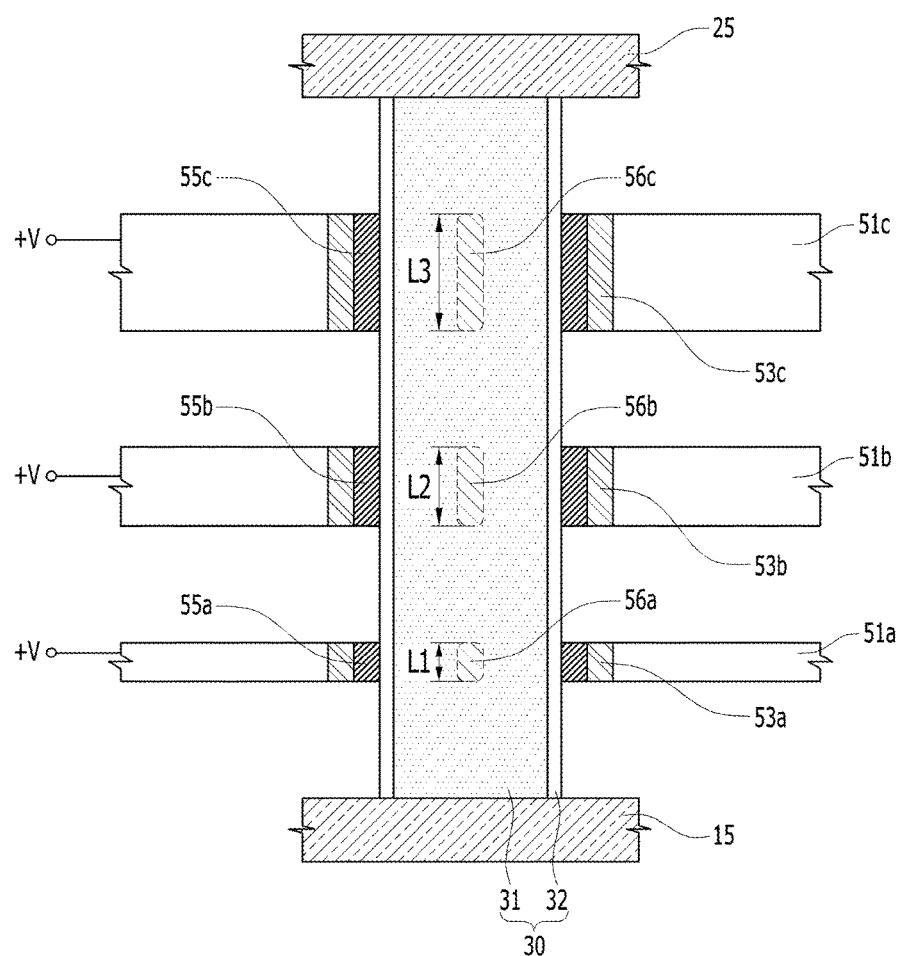

FIGS. 4F and 4G are views illustrating a structure and an operation of a synapse system of a neuromorphic device in accordance with an embodiment of the present disclosure. In addition to the structure of the synapse system shown in FIG. 4D, the synapse system of the neuromorphic device shown in FIG. 4F may further include first to third barrier layers 53a to 53c that are formed between the first to third gating lines 51a to 51c and the first to third absorption layers 52a to 52c. The first to third barrier layers 53a to 53c may have hollow cylinder shapes that surround outer surfaces of the first to third absorption layers 52a to 52c, respectively. The first to third barrier layers 53a to 53c may block oxygen ions, which have moved from the core 31 of the synapse 30, from diffusing or moving to the first to third gating lines 51a to 51c. Each of the first to third barrier layers 53a to 53c may include one or more of gold (Au), platinum (Pt), silver (Ag), nickel (Ni), tin (Sn), chrome (Cr), titanium nitride (TiN), tungsten nitride (WN), another metal nitride, and an oxidization-resistant conductive material.

Referring to FIG. 4G, when a positive (+) voltage is applied to the first to third gating lines 51a to 51c, oxygen ions in the core 31 of the synapse 30 may move to the first to third absorption layers 52a to 52c through the tunnel layer 32. Accordingly, the first to third absorption layers 52a to 52c may be converted into first to third oxidized layers 55a to 55c, respectively. First to third channels 56a to 56c may be formed in the core 31 of the synapse 30. Because the oxygen ions are prevented from diffusing or moving to the first to third gating lines 51a to 51c by the first to third barrier layers 53a to 53c, the first to third gating lines 51a to 51c may not be oxidized. The positive (+) voltage may be applied selectively to the first to third gating lines 51a to 51c.

In another embodiment of the present disclosure, the second thickness T2 may be equal to two times the first thickness T1, and the third thickness T3 may be equal to four times the first thickness T1. Therefore, the third vertical length L3 of the third channel 56c may be equal to four times the first vertical length L1 of the first channel 56a. As summarized in the following Table 3, when the positive (+) voltage is applied selectively to the first to third gating lines 51a to 51c, the first to third channels 56a to 56c are formed selectively, and thus the core 31 may have eight resistance levels Level 0 to Level 7.

TABLE 3

| Resistance Value | First Gating Line | Second Gating Line | Third Gating Line |
| --- | --- | --- | --- |
| Level 0 | Off | Off | Off |
| Level 1 | On | Off | Off |
| Level 2 | Off | On | Off |
| Level 3 | On | On | Off |
| Level 4 | Off | Off | On |
| Level 5 | On | Off | On |
| Level 6 | Off | On | On |
| Level 7 | On | On | On |

Figure 5A:
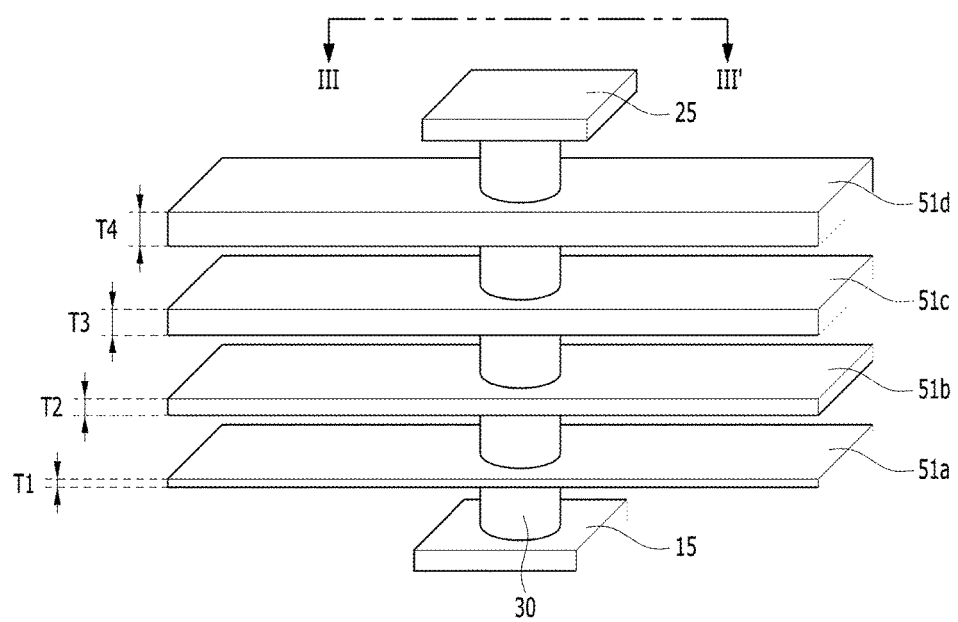
FIG. 5A is a perspective view illustrating a synapse system of a neuromorphic device in accordance with an embodiment of the present disclosure.
Figure 5B:
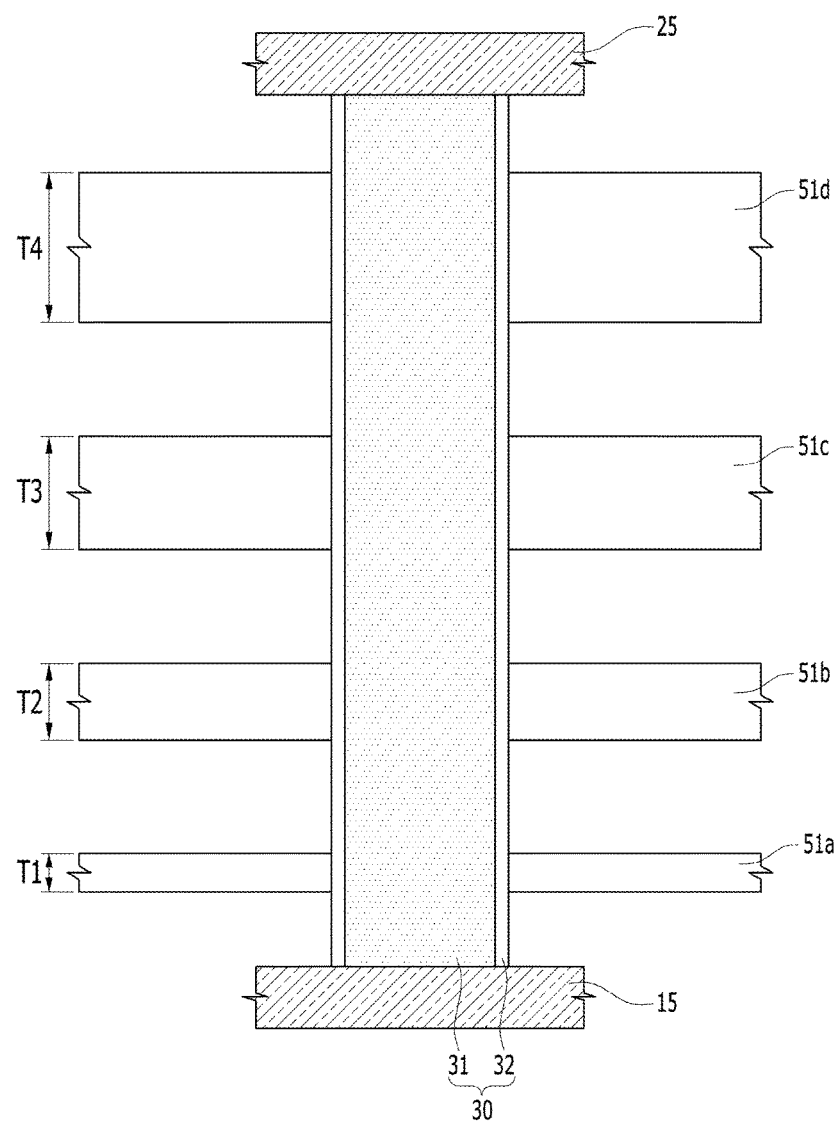
FIGS. 5B to 5D are cross-sectional views taken along line III-III' of FIG. 5A.
Figure 5C:
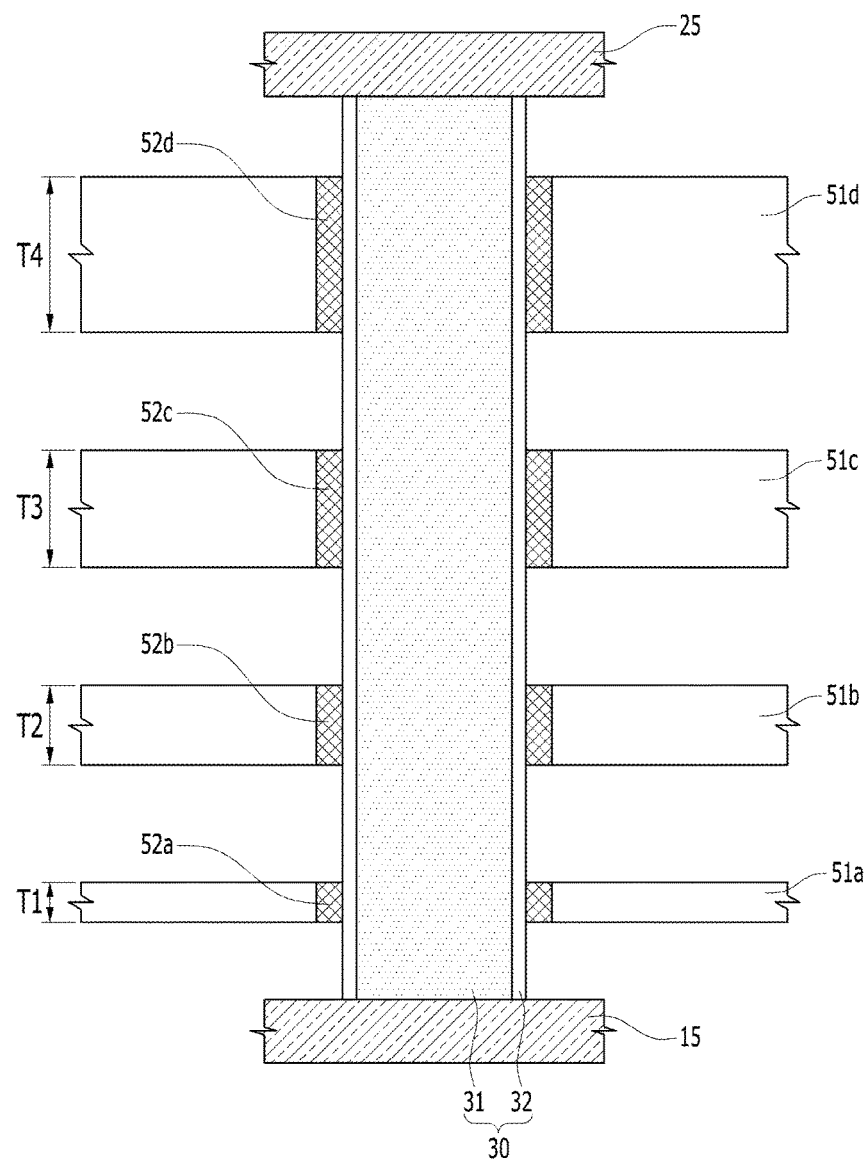
Figure 5D:
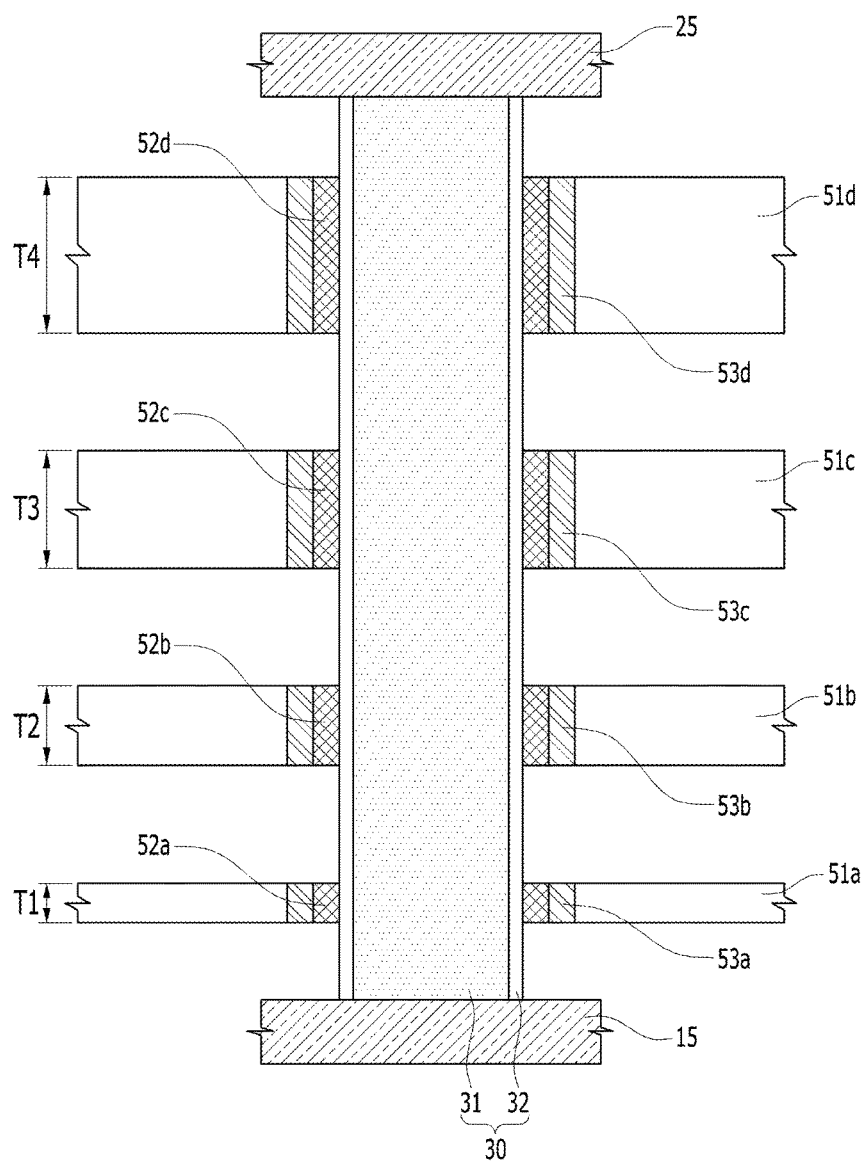

FIG. 5A is a perspective view illustrating a synapse system of a neuromorphic device in accordance with an embodiment of the present disclosure, and FIGS. 5B to 5D are cross-sectional views taken along line III-III' of FIG. 5A.

Referring to FIGS. 5A and 5B, a synapse system of a neuromorphic device may include a row line 15, a column line 25, first to fourth gating lines 51a to 51d disposed between the row line 15 and the column line 25, and a synapse 30 that passes through the first to fourth gating lines 51a to 51d. The first to fourth gating lines 51a to 51d may have different thicknesses T1, T2, T3, and T4, respectively. In an embodiment, the second thickness T2 is equal to two times the first thickness T1, the third thickness T3 is equal to three times the first thickness T1, and the fourth thickness T4 is equal to four times the first thickness T1. Positions of the first to fourth gating lines 51a to 51d may be changed with one another in accordance with various embodiments.

In addition to the structure of the synapse system of the neuromorphic device described above with reference to FIG. 5B, a synapse system of a neuromorphic device of FIG. 5C may further include first to fourth absorption layers 52a to 52d, which are respectively formed between the first to fourth gating lines 51a to 51d and the synapse 30.

In addition to the structure of the synapse system shown in FIG. 5C, a synapse system of a neuromorphic device shown in FIG. 5D may further include first to fourth barrier layers 53a to 53d which are formed between the first to fourth gating lines 51a to 51d and the first to fourth absorption layers 52a to 52d, respectively.

When a positive (+) voltage is applied selectively to the first to fourth gating lines 51a to 51d, the first to fourth absorption layers 52a to 52d may be converted selectively to first to fourth oxidized layers (not shown), and first to fourth channels (not shown), which have vertical lengths corresponding to the thicknesses T1, T2, T3, and T4 of the first to fourth gating lines 51a to 51d, may be formed selectively. The oxidized layers and the channels are not illustrated in FIGS. 5C and 5D, but they may be understood from the above other embodiments.

It is summarized in the following Table 4 that, when the positive (+) voltage is applied selectively to the first to fourth gating lines 51a to 51d, the first to fourth channels are formed selectively, and thus the core 31 may have 11 resistance levels Level 0 to Level 10.

TABLE 4

| Resistance Level | First Gating Line | Second Gating Line | Third Gating Line | Fourth Gating Line |
|---|---|---|---|---|
| Level 0 | Off | Off | Off | Off |
| Level 1 | On | Off | Off | Off |
| Level 2 | Off | On | Off | Off |
| Level 3 | On | On | Off | Off |
|  | Off | Off | On | Off |
| Level 4 | Off | Off | Off | On |
| Level 5 | On | Off | Off | On |
| Level 6 | Off | On | Off | On |
| Level 7 | On | On | Off | On |
|  | Off | Off | On | On |
| Level 8 | On | Off | On | On |
| Level 9 | Off | On | On | On |
| Level 10 | On | On | On | On |

According to the present disclosure, the number of gating lines (51x) may be further increased, and/or vertical thicknesses (Tx) of the gating lines (51x) may be further diversified. Thus, vertical lengths (Lx) of channels (56x) may be further diversified as well. As a result, the resistance levels of the core 31 may also be diversified.

Figure 6A:
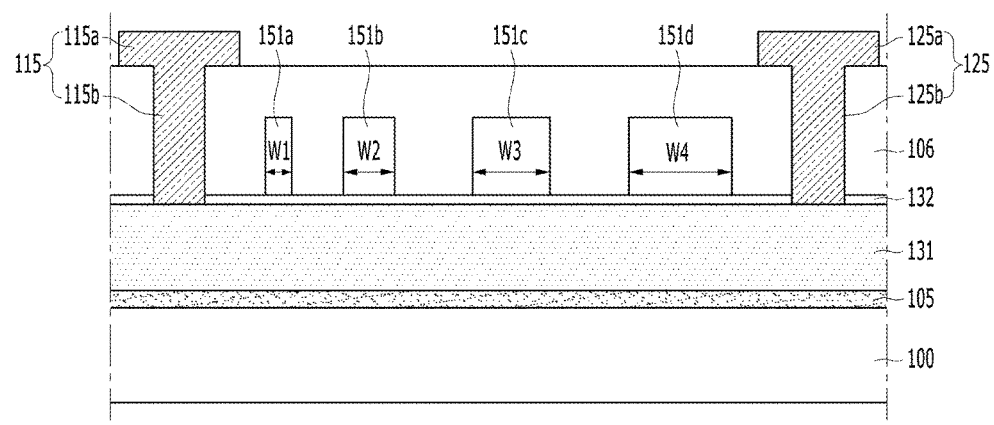
FIG. 6A is a diagram conceptually illustrating a variable resistance system in accordance with an embodiment of the present disclosure.

FIG. 6A is a diagram conceptually illustrating a variable resistance system in accordance with an embodiment of the present disclosure. Referring to FIG. 6A, the variable resistance system may include a buffer layer 105 on a substrate 100, a variable resistance layer 131, a tunnel layer 132, a first bit line structure 115, a second bit line structure 125, gating lines 151a to 151d, and an interlayer dielectric layer 106. The first bit line structure 115 may include a first bit line wire 115a and a first bit line plug 115b, and the second bit line structure 125 may include a second bit line wire 125a and a second bit line plug 125b.

The substrate 100 may include a silicon wafer, or a metal, glass, ceramic, or plastic substrate. The buffer layer 105 may isolate the substrate 100 and the variable resistance layer 131 physically and electrically. For example, the buffer layer 105 may block ion movement between the substrate 100 and the variable resistance layer 131. The buffer layer 105 may include a dielectric material such as a silicon nitride. The variable resistance layer 131 may include a perovskite-based material (such as $Pr_xCa_yMnO_3$ or PCMO, wherein x and y are positive numbers and, for example, x+y=1). The tunnel layer 132 may include a silicon oxide, a silicon nitride, or another dielectric material. Each of the first bit line structure 115 and the second bit line structure 125 may include one or more of tungsten (W), tungsten nitride (WN), copper (Cu), titanium nitride (TiN), an inoxidizable metal, and an inoxidizable metal compound. Each of the gating lines 151a to 151d may include one of metals capable of being partially oxidized by being coupled with oxygen ions. For example, the metals include aluminum (Al), titanium (Ti), hafnium (Hf), zirconium (Zr), lanthanum (La), niobium (Nb), yttrium (Y), strontium (Sr), and another oxidizable metal. The interlayer dielectric layer 106 may include any one of a silicon oxide, a silicon nitride, a dielectric organic, and a combination thereof.

The gating lines 151a to 151d may have different horizontal widths with respect to the orientation of FIG. 6A. For example, the first gating line 151a may have a first horizontal width W1, the second gating line 151b may have a second horizontal width W2, the third gating line 151c may have a third horizontal width W3, and the fourth gating line 151d may have a fourth horizontal width W4.

Figure 6B:
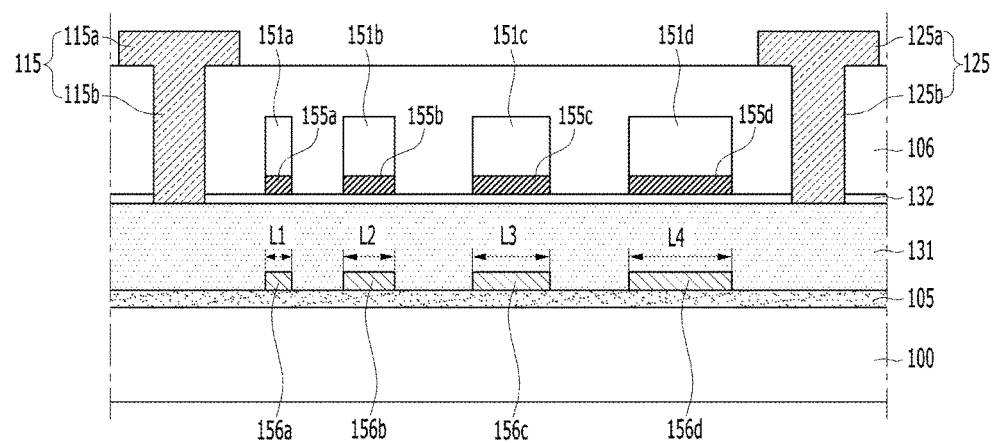
FIG. 6B is a diagram illustrating an operation of the variable resistance system shown in FIG. 6A.

FIG. 6B is a diagram illustrating an operation of the variable resistance system shown in FIG. 6A. Referring to FIG. 6B, when a positive (+) voltage is applied to the first to fourth gating lines 151a to 151d, portions of the first to fourth gating lines 151a to 151d that are adjacent to the tunnel layer 132 may be converted into first to fourth oxidized layers 155a to 155d, respectively, and first to fourth channels 156a to 156d may be formed in the variable resistance layer 131. The first to fourth oxidized layers 155a to 155d may be formed when oxygen ions in the variable resistance layer 131 move to the first to fourth gating lines 151a to 151d through the tunnel layer 132. Accordingly, as the variable resistance layer 131 becomes deficient in oxygen ions, the first to fourth channels 156a to 156d may be formed. The first to fourth oxidized layers 155a to 155d may be adjacent to the tunnel layer 132, and the first to fourth channels 156a to 156d may be adjacent to the buffer layer 105.

Figure 6C:
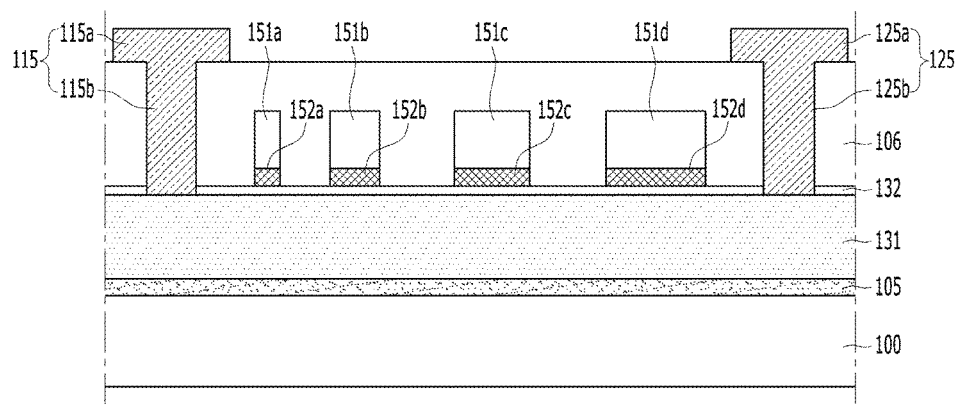
FIG. 6C is a diagram conceptually illustrating a variable resistance system in accordance with an embodiment of the present disclosure.

FIG. 6C is a diagram conceptually illustrating a variable resistance system in accordance with an embodiment of the present disclosure. In addition to the structure of the variable resistance system shown in FIG. 6A, the variable resistance system shown in FIG. 6C may further include first to fourth absorption layers 152a to 152d, which are formed between the first to fourth gating lines 151a to 151d and the tunnel layer 132. The first to fourth absorption layers 152a to 152d may absorb oxygen ions which moved from the variable resistance layer 131 through the tunnel layer 132. That is to say, the first to fourth absorption layers 152a to 152d may be easily oxidized. For example, each of the first to fourth absorption layers 152a to 152d may include one or more of aluminum (Al), titanium (Ti), hafnium (Hf), zirconium (Zr), lanthanum (La), niobium (Nb), yttrium (Y), strontium (Sr), and another oxidizable metal. The first to fourth gating lines 151a to 151d may include one or more of gold (Au), platinum (Pt), silver (Ag), nickel (Ni), tin (Sn), chrome (Cr), titanium nitride (TiN), tungsten nitride (WN), a conductive metal nitride, and an oxidization-resistant conductive material, which are not easily oxidized.

Figure 6D:
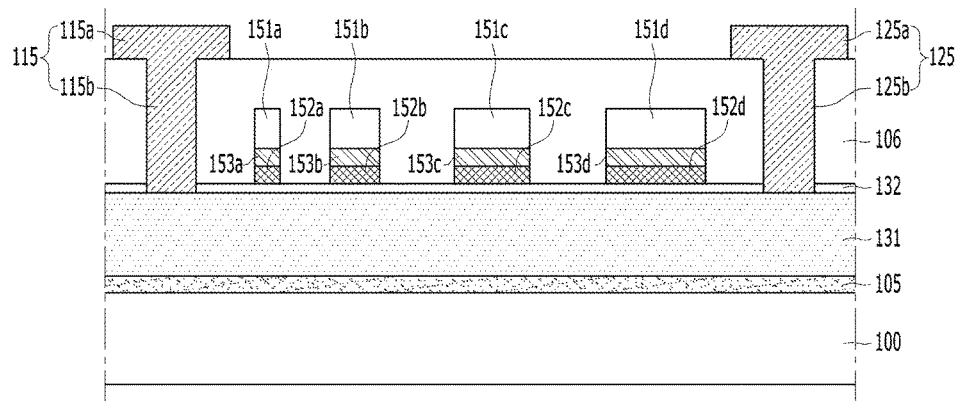
FIG. 6D is a diagram conceptually illustrating a variable resistance system in accordance with an embodiment of the present disclosure.

FIG. 6D is a diagram conceptually illustrating a variable resistance system in accordance with an embodiment of the present disclosure. In addition to the structure of the variable resistance system shown in FIG. 6C, the variable resistance system shown in FIG. 6D may further include first to fourth barrier layers 153a to 153d, which are respectively formed between the first to fourth gating lines 151a to 151d and the first to fourth absorption layers 152a to 152d. Each of the first to fourth barrier layers 153a to 153d may include one or more of gold (Au), platinum (Pt), silver (Ag), nickel (Ni), tin (Sn), chrome (Cr), titanium nitride (TiN), tungsten nitride (WN), another metal nitride, and an oxidation-resistant conductive material.

Figure 6E:
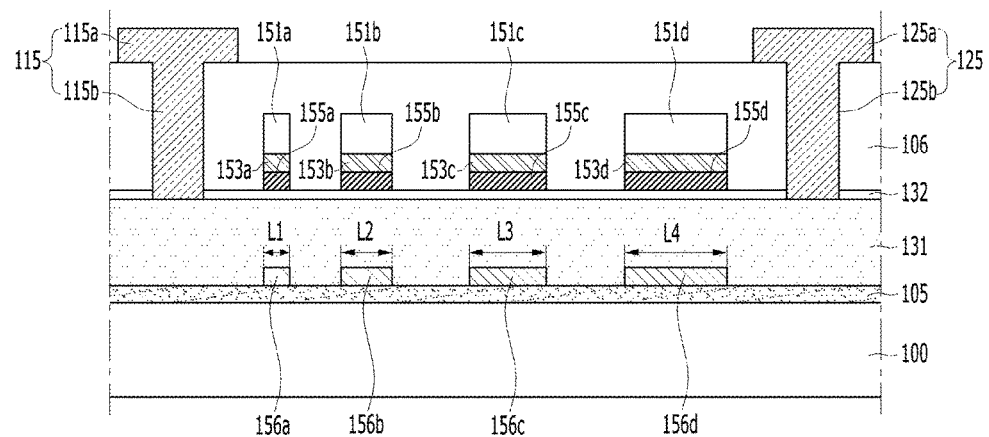
FIG. 6E is a diagram illustrating an operation of the variable resistance system shown in FIG. 6D.

FIG. 6E is a diagram illustrating an operation of the variable resistance system shown in FIG. 6D. Referring to FIG. 6E, when a positive (+) voltage is applied to the first to fourth gating lines 151a to 151d, the first to fourth absorption layers 152a to 152d may be converted into first to fourth oxidized layers 155a to 155d, respectively, and first to fourth channels 156a to 156d may be formed in the variable resistance layer 131. The first to fourth barrier layers 153a to 153d may block oxygen ions in the variable resistance layer 131 from moving to the first to fourth gating lines 151a to 151d, respectively.

Figure 7:
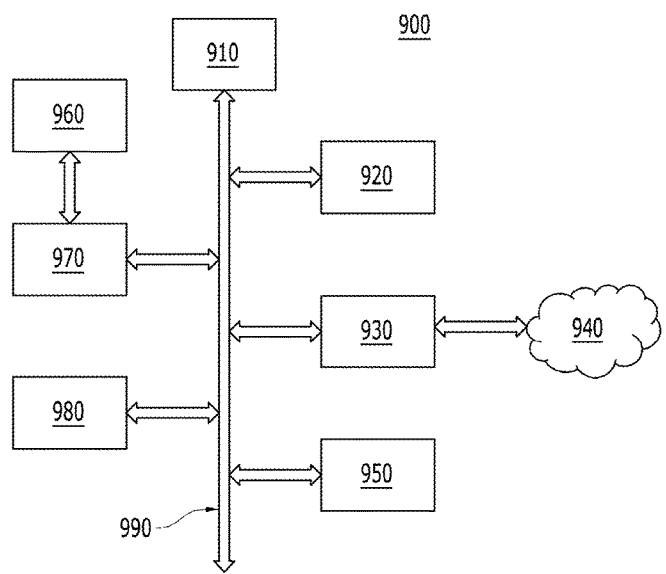
FIG. 7 is a block diagram conceptually illustrating a pattern recognition system in accordance with an embodiment of the present disclosure.

FIG. 7 is a block diagram conceptually illustrating a pattern recognition system 900 in accordance with an embodiment. For example, the pattern recognition system 900 may include one of a speech recognition system, an image recognition system, a code recognition system, a signal recognition system, and a system for recognizing various patterns.

Referring to FIG. 7, the pattern recognition system 900 in accordance with the embodiment may include a central processing unit (CPU) 910, a memory unit 920, a communication control unit 930, a network 940, an output unit 950, an input unit 960, an analog-digital converter (ADC) 970, a neuromorphic unit 980, and a bus 990. The CPU 910 may generate and transmit various signals for a learning process to be performed by the neuromorphic unit 980, and perform a variety of processes and functions for recognizing patterns such as voice and images according to an output of the neuromorphic unit 980.

The CPU 910 may be connected to the memory unit 920, the communication control unit 930, the output unit 950, the ADC 970, and the neuromorphic unit 980 through the bus 990.

The memory unit 920 may store information in accordance with operations of the pattern recognition system 900. The memory unit 920 may include one or more of a volatile memory device such as DRAM or SRAM, a nonvolatile memory device such as PRAM, MRAM, ReRAM, or NAND flash memory, and a memory unit such as a HDD (Hard Disk Drive) or a SSD (Solid State Drive).

The communication control unit 930 may transmit and/or receive data such as a recognized voice and image to and/or from a communication control unit of another system through the network 940.

The output unit 950 may output the data such as the recognized voice and image using various methods. For example, the output unit 950 may include one or more of a speaker, a printer, a monitor, a display panel, a beam projector, a hologrammer, and so on.

The input unit 960 may include one or more of a microphone, a camera, a scanner, a touch pad, a keyboard, a mouse, a mouse pen, a sensor, and so on.

The ADC 970 may convert analog data transmitted from the input unit 960 into digital data.

The neuromorphic unit 980 may perform learning and recognition using the data transmitted from the ADC 970, and output data corresponding to a recognized pattern. The neuromorphic unit 980 may include one or more of the neuromorphic devices in accordance with the various embodiments.

According to the embodiments of the present disclosure, a synapse system may have multiple resistance levels. Accordingly, a learning level of a synapse of a neuromorphic device may be subdivided.

Although various embodiments have been described for illustrative purposes, it will be apparent to those skilled in the art that various changes and modifications may be made without departing from the spirit and scope of the invention as defined in the following claims.

What is claimed is:

1. A neuromorphic device comprising:
   a conductive row line extending in a first horizontal direction;
   a conductive column line disposed over the row line, the column line extending in a second horizontal direction perpendicular to the first horizontal direction;
   a plurality of gating lines disposed between the row line and the column line;
   a synapse extending in a vertical direction to be disposed between the row line and the column line, the synapse being electrically connected with the row line and the column line and passing through the plurality of gating lines; and
   a plurality of conductive absorption layers respectively disposed between the plurality of gating lines and the synapse,
   wherein the plurality of conductive absorption layers are oxidizable metals,
   wherein the plurality of gating lines includes a first gating line having a first thickness and a second gating line having a second thickness, the second thickness being two times the first thickness,
   wherein the synapse comprises a core and a tunnel layer, the core having a pillar shape, the tunnel layer surrounding an outer surface of the core,
   wherein the core comprises a perovskite-based material including oxygen ions, and
   wherein each of the plurality of gating lines comprises an oxidizable metal.

2. The neuromorphic device according to claim 1, wherein the plurality of gating lines are disposed to be in parallel with each other.

3. The neuromorphic device according to claim 2, wherein at least one of the plurality of gating lines is in parallel with one of the row line and the column line.

4. The neuromorphic device according to claim 1, wherein each of the plurality of conductive absorption layers is oxidized by the oxygen ions served from the synapse.

5. The neuromorphic device according to claim 1, wherein the plurality of conductive absorption layers have hollow cylinder shapes that respectively surround portions of an outer surface of the synapse.

6. The neuromorphic device according to claim 1, further comprising:
   a plurality of conductive barrier layers respectively disposed between the plurality of gating lines and the plurality of conductive absorption layers.

7. The neuromorphic device according to claim 6, wherein each of the plurality of barrier layers includes one or more of gold (Au), platinum (Pt), silver (Ag), nickel (Ni), tin (Sn), chrome (Cr), titanium nitride (TiN), tungsten nitride (WN), another metal nitride, and an oxidization-resistant conductive material.

8. The neuromorphic device according to claim 6, wherein the plurality of barrier layers have hollow cylinder shapes that respectively surround outer surfaces of the plurality of conductive absorption layers.

9. A neuromorphic device, comprising:
a conductive row line extending in a first horizontal direction;
a conductive column line disposed over the row line, the column line extending in a second horizontal direction perpendicular to the first horizontal direction;
a plurality of gating lines disposed between the row line and the column line, the plurality of gating lines extending in parallel with one of the first and second horizontal directions;
a synapse extending in a vertical direction to be disposed between the row line and the column line, the synapse being electrically connected with the row line and the column line and passing through the plurality of gating lines; and
at least three absorption layers respectively disposed between at least three gating lines and a tunnel layer to surround portions of an outer surface of the tunnel layer, each of the at least three absorption layers including an oxidizable metal,
wherein the synapse includes a core and the tunnel layer, the core having a pillar shape, the tunnel layer surrounding an outer surface of the core,
wherein the core comprises a perovskite-based material including oxygen ions,
wherein each of the plurality of gating lines comprises an oxidizable metal,
wherein the plurality of gating lines comprise the at least three gating lines having at least three different thicknesses, and
wherein the plurality of gating lines comprises a first gating line having a first thickness, a second gating line having a second thickness, and a third gating line having a third thickness, the second thickness being two times the first thickness, the third thickness being two times the second thickness.

10. The neuromorphic device according to claim 9, wherein the tunnel layer includes one of a silicon oxide, a silicon nitride, or a combination thereof.

11. The neuromorphic device according to claim 9, further comprising:
at least three conductive barrier layers respectively disposed between the at least three gating lines and the at least three absorption layers, each of the at least three barrier layers including an oxidization-resistant metal.

12. A neuromorphic device comprising:
a conductive row line extending in a first horizontal direction;
a conductive column line extending in a second horizontal direction perpendicular to the first horizontal direction;
a plurality of gating lines disposed between the row line and the column line, the plurality of gating lines extending in parallel with each other;
a synapse extending in a vertical direction to be disposed between the row line and the column line, wherein the synapse comprises a core having a pillar shape and a tunnel layer having a cylinder shape to surround the core; and
a plurality of conductive absorption layers respectively disposed between the plurality of gating lines and the tunnel layer,
wherein the plurality of gating lines comprises a first gating line having a first thickness and a second gating line having a second thickness,
wherein the second thickness is integer multiple of the first thickness,
wherein the plurality of conductive absorption layers are oxidizable metals,
wherein the core of the synapse includes oxygen ions, and each of the plurality of conductive absorption layers includes an oxidizable metal that is oxidized by the oxygen ions served from the core,
wherein the plurality of gating lines further comprises a third gating line having a third thickness, the third thickness being integer multiple of the second thickness, and
wherein the neuromorphic device further comprises a plurality of barrier layers disposed between the plurality of gating lines and the plurality of conductive absorption layers, wherein the plurality of barrier layers comprises an oxidization-resistant conductive metallic material.

* * * * *